(12) United States Patent
Ohsawa et al.

(10) Patent No.: US 9,876,185 B2
(45) Date of Patent: Jan. 23, 2018

(54) LIGHT-EMITTING DEVICE COMPRISING LIGHT-EMITTING LAYERS

(71) Applicant: Semiconductor Energy Laboratory Co., Ltd., Kanagawa-ken (JP)

(72) Inventors: Nobuharu Ohsawa, Kanagawa (JP); Takahiro Ushikubo, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/183,243

(22) Filed: Jun. 15, 2016

(65) Prior Publication Data

US 2016/0315279 A1     Oct. 27, 2016

Related U.S. Application Data

(63) Continuation of application No. 14/952,546, filed on Nov. 25, 2015, now Pat. No. 9,373,808, which is a (Continued)

(30) Foreign Application Priority Data

Nov. 29, 2012  (JP) ................................ 2012-261011
Dec. 3, 2012   (JP) ................................ 2012-264071
Mar. 6, 2013   (JP) ................................ 2013-043643

(51) Int. Cl.
  *H01L 51/50*   (2006.01)
  *H01L 51/00*   (2006.01)

(52) U.S. Cl.
  CPC ........ *H01L 51/5016* (2013.01); *H01L 51/504* (2013.01); *H01L 51/5056* (2013.01);
  (Continued)

(58) Field of Classification Search
  CPC ............... H01L 51/504; H01L 51/0054; H01L 51/0052
  See application file for complete search history.

(56) References Cited

U.S. PATENT DOCUMENTS 6,097,147 A    8/2000  Baldo et al.
6,830,828 B2  12/2004  Thompson et al.
(Continued)

FOREIGN PATENT DOCUMENTS

EP    2 133 932 A1   12/2009
EP    2 166 592 A1    3/2010
(Continued)

OTHER PUBLICATIONS

Miyasaka, M., "SUFTLA Flexible Microelectronics on Their Way to Business," SID Digest '07: SID International Symposium Digest of Technical Papers, 2007, vol. 38, pp. 1673-1676.
(Continued)

*Primary Examiner* — Dung Le
(74) *Attorney, Agent, or Firm* — Husch Blackwell LLP

(57) ABSTRACT

A light-emitting element at least includes a first electrode, a first light-emitting layer over the first electrode, a second light-emitting layer over and in contact with the first light-emitting layer, a third light-emitting layer over and in contact with the first light-emitting layer, and a second electrode over the third light-emitting layer. Each of the first light-emitting layer and the second light-emitting layer contains a phosphorescent compound. The third light-emitting layer contains a fluorescent compound. Each of the first light-emitting layer, the second light-emitting layer, and the third light-emitting layer includes an organic compound.

21 Claims, 20 Drawing Sheets

Related U.S. Application Data continuation of application No. 14/090,241, filed on Nov. 26, 2013, now Pat. No. 9,203,045.

(52) U.S. Cl.
CPC ...... *H01L 51/5072* (2013.01); *H01L 51/5092* (2013.01); *H01L 51/006* (2013.01); *H01L 51/0052* (2013.01); *H01L 51/0054* (2013.01); *H01L 51/0058* (2013.01); *H01L 51/0059* (2013.01); *H01L 51/0061* (2013.01); *H01L 51/0072* (2013.01); *H01L 51/0074* (2013.01); *H01L 51/0085* (2013.01); *H01L 51/5088* (2013.01); *H01L 2251/5376* (2013.01); *H01L 2251/5384* (2013.01)

(56) References Cited

U.S. PATENT DOCUMENTS

| | | |
|---|---|---|
| 6,902,830 B2 | 6/2005 | Thompson et al. |
| 7,001,536 B2 | 2/2006 | Thompson et al. |
| 7,291,406 B2 | 11/2007 | Thompson et al. |
| 7,537,844 B2 | 5/2009 | Thompson et al. |
| 7,883,787 B2 | 2/2011 | Thompson et al. |
| 8,207,526 B2 | 6/2012 | Nishimura et al. |
| 8,426,036 B2 | 4/2013 | Nishimura et al. |
| 8,557,402 B2 | 10/2013 | Thompson et al. |
| 8,574,726 B2 | 11/2013 | Thompson et al. |
| 9,051,233 B2 | 6/2015 | Buesing et al. |
| 9,090,532 B2 | 7/2015 | Kaiser et al. |
| 9,209,415 B2 | 12/2015 | Shitagaki et al. |
| 2009/0226757 A1 | 9/2009 | Song et al. |
| 2010/0006845 A1 | 1/2010 | Seo et al. |
| 2010/0207110 A1 | 8/2010 | Nishimura et al. |
| 2010/0225252 A1* | 9/2010 | Weaver ............... H01L 27/3211 315/312 |
| 2011/0057178 A1 | 3/2011 | Shitagaki et al. |
| 2011/0101328 A1 | 5/2011 | Kaiser et al. |
| 2011/0284831 A1 | 11/2011 | Kaiser et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0241794 A1 | 9/2012 | Seo et al. |
| 2012/0274201 A1 | 11/2012 | Seo et al. |
| 2012/0286300 A1* | 11/2012 | Kijima ............... H01L 51/5275 257/88 |
| 2013/0161666 A1 | 6/2013 | Ghosh et al. |
| 2013/0187143 A1 | 7/2013 | Nishimura et al. |
| 2014/0008639 A1 | 1/2014 | Thompson et al. |
| 2015/0041780 A1 | 2/2015 | Ma |
| 2015/0155514 A1 | 6/2015 | Kaiser et al. |
| 2015/0228905 A1 | 8/2015 | Buesing et al. |

FOREIGN PATENT DOCUMENTS

| | | |
|---|---|---|
| JP | 2007-059118 A | 3/2007 |
| JP | 2011-077032 A | 4/2011 |
| JP | 2011-529614 | 12/2011 |
| JP | 2012-512536 | 5/2012 |
| JP | 2012-519944 | 8/2012 |
| WO | WO 00/70655 A2 | 11/2000 |
| WO | WO 2008/123178 A1 | 10/2008 |
| WO | WO 2009/008357 A1 | 1/2009 |
| WO | WO 2011/027653 A1 | 3/2011 |

OTHER PUBLICATIONS

Hatano, K. et al., "3.4-Inch QHD Flexible Amoled With Oxide TFT," AM-FPD '10 Digest of Technical Papers, Jul. 1, 2010, pp. 263-266.

Hatano, K. et al., "36.4: 3.4-inch Full-Color QHD AMOLED Display using Large-Size Flexible Substrate with Highly Reliable OS-FETs," SID Digest '11: SID International Symposium Digest of Technical Papers, 2011, vol. 42, No. 1, pp. 498-500.

Ma, R. et al., "Flexible OLEDs for Lighting Applications," SID Digest '12: SID International Symposium Digest of Technical Papers, Jun. 1, 2012, vol. 43, No. 1, pp. 772-775.

Tang, C.W. et al., "Organic Electroluminescent Diodes," Applied Physics Letters, Sep. 21, 1987, vol. 51, No. 12, pp. 913-915.

Adachi, C. et al., "Electroluminescence in Organic Films With Three-Layer Structure," Japanese Journal of Applied Physics, Feb. 20, 1988, vol. 27, No. 2, pp. L269-L271.

Liao, L.S. et al., "High-Efficiency Tandem Organic Light-Emitting Diodes," Applied Physics Letters, Jan. 12, 2004, vol. 84, No. 2, pp. 167-169.

Tsutsui, T. et al., "High Quantum Efficiency in Organic Light-Emitting Devices With Iridium-Complex as a Triplet Emissive Center," Japanese Journal of Applied Physics, Dec. 15, 1999, vol. 38, No. 12B, pp. L1502-L1504.

Baldo, M.A. et al., "Highly Efficient Phosphorescent Emission From Organic Electroluminescent Devices," Nature, Sep. 10, 1998, vol. 395, pp. 151-154.

Baldo, M. et al., "Very High-Efficiency Green Organic Light-Emitting Devices Based on Electrophosphorescence," Applied Physics Letters, Jul. 5, 1999, vol. 75, No. 1, pp. 4-6.

Adachi, C. et al., "Nearly 100% Internal Phosphorescence Efficiency in an Organic Light Emitting Device," Journal of Applied Physics, Nov. 15, 2001, vol. 90, No. 10, pp. 5048-5051.

Hatwar, T. et al., "52.2: Hybrid Tandem White OLEDs with High Efficiency and Long Life-time for AMOLED Displays and Solid-State Lighting," SID Digest '10: SID International Symposium Digest of Technical Papers, 2010, vol. 41, No. 1, pp. 778-781.

D'Andrade, B. et al., "102 lm/W White Phosphorescent OLED," IDW '08: Proceedings of the 15th International Display Workshops, Dec. 3, 2008, pp. 143-144.

Levermore, P. et al., "52.4: Highly Efficient Phosphorescent OLED Lighting Panels for Solid State Lighting," SID Digest '10: SID International Symposium Digest of Technical Papers, 2010, vol. 41, No. 1, pp. 786-789.

Kondakova, M. et al., "Highly Efficient Fluorescent-Phosphorescent Triplet-Harvesting Hybrid Organic Light-Emitting Diodes," Journal of Applied Physics, 2010, vol. 107, No. 1, pp. 014515-1-014515-13.

Loebl, P. et al., "66.3: Hybrid White OLEDs for General Lighting," SID Digest '11: SID International Symposium Digest of Technical Papers, 2011, vol. 42, No. 1, pp. 979-982.

Ikeda, H. et al., "P-185: Low-Drive-Voltage OLEDS With a Buffer Layer Having Molybdenum Oxide," SID Digest '06: SID International Symposium Digest of Technical Papers, 2006, vol. 37, pp. 923-926.

Reineke, S. et al., "White Organic Light-Emitting Diodes with Fluorescent Tube Efficiency," Nature, May 14, 2009, vol. 459, pp. 234-239.

\* cited by examiner

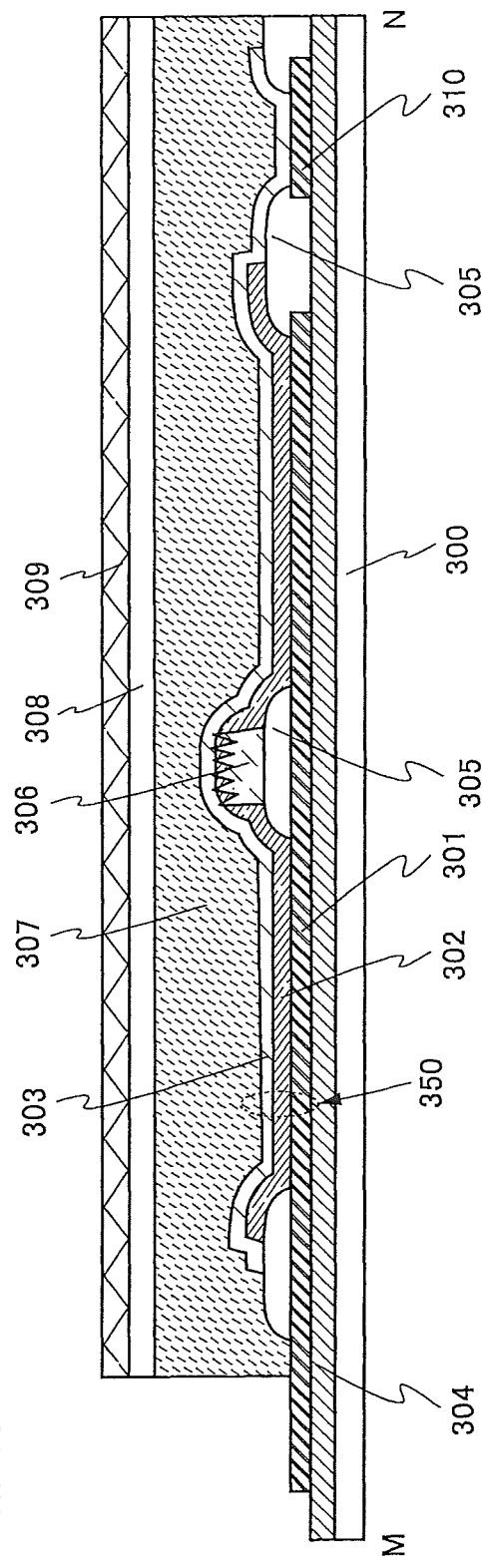
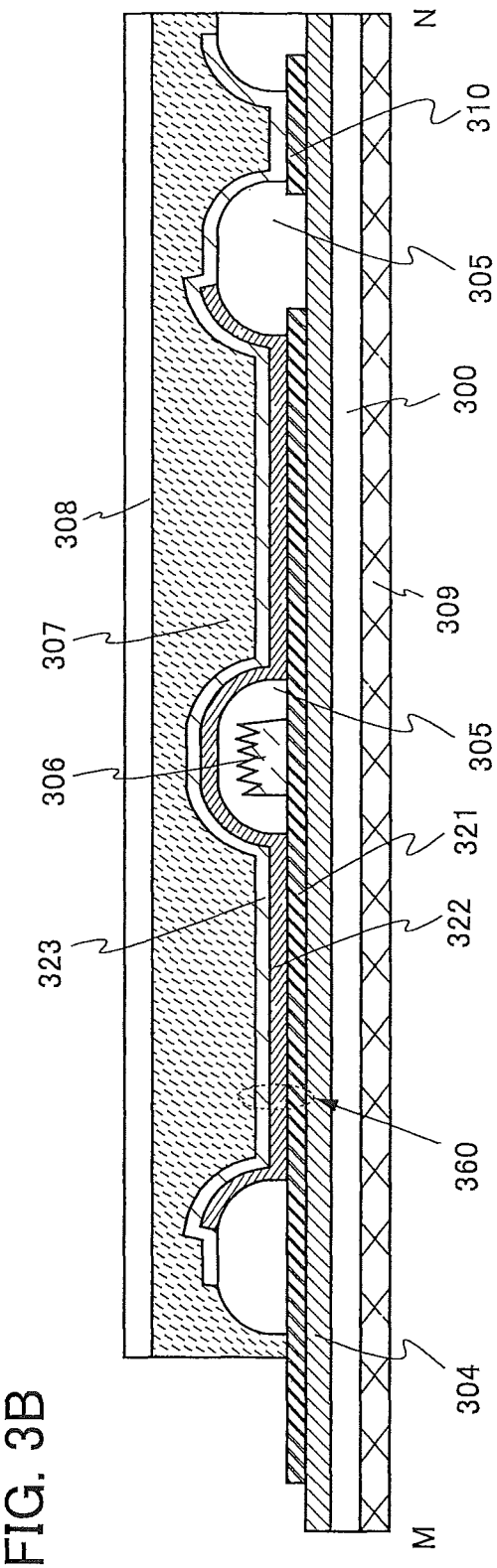

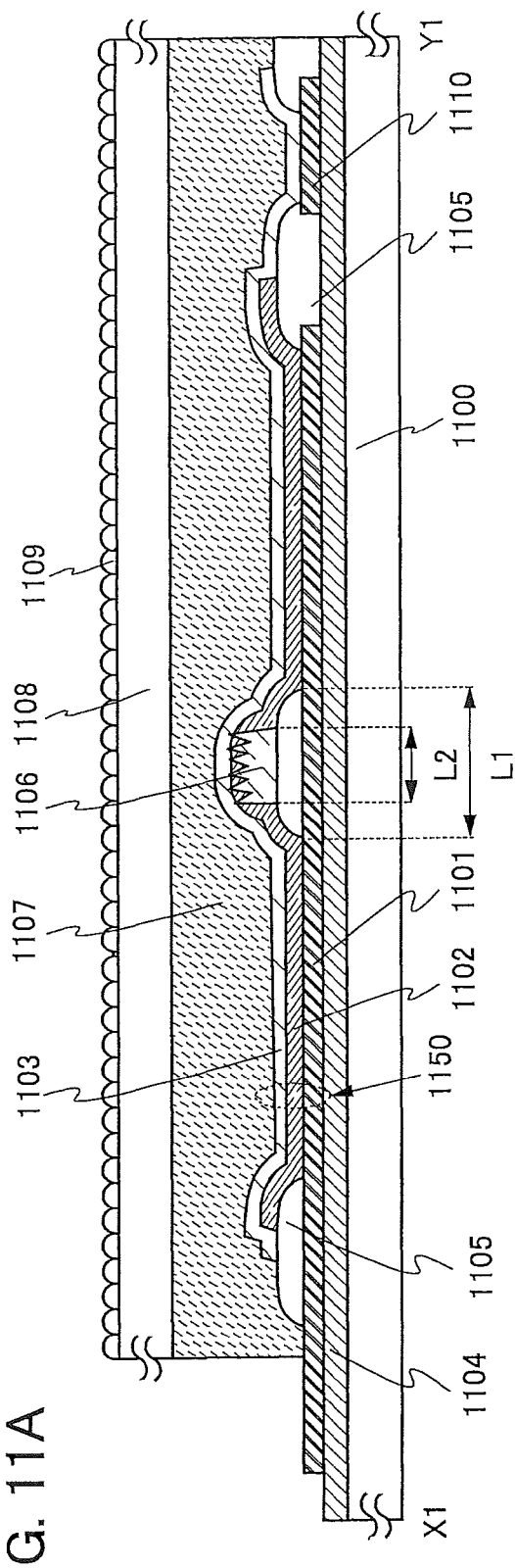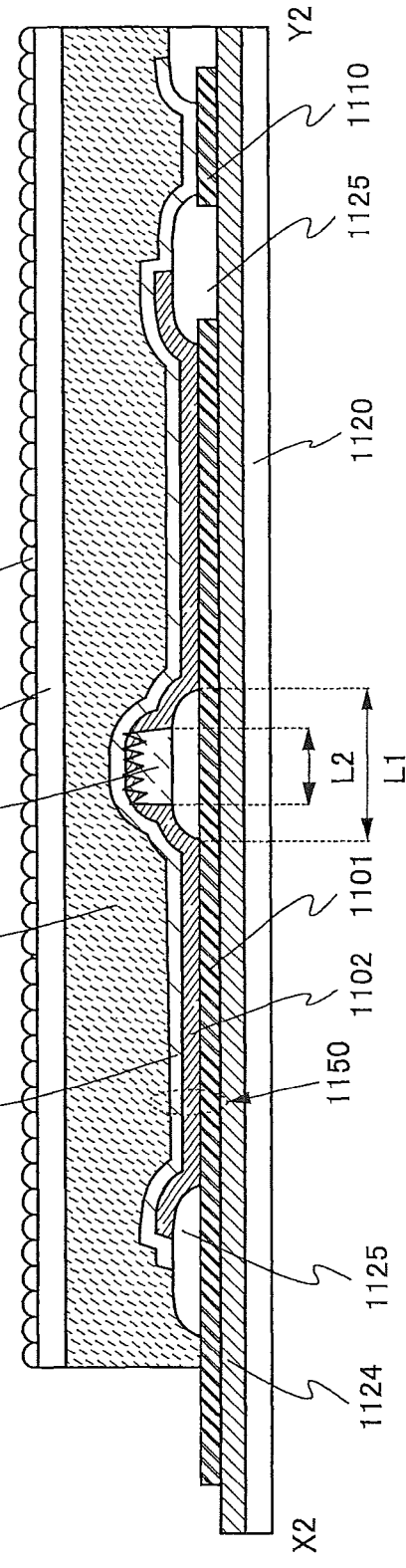

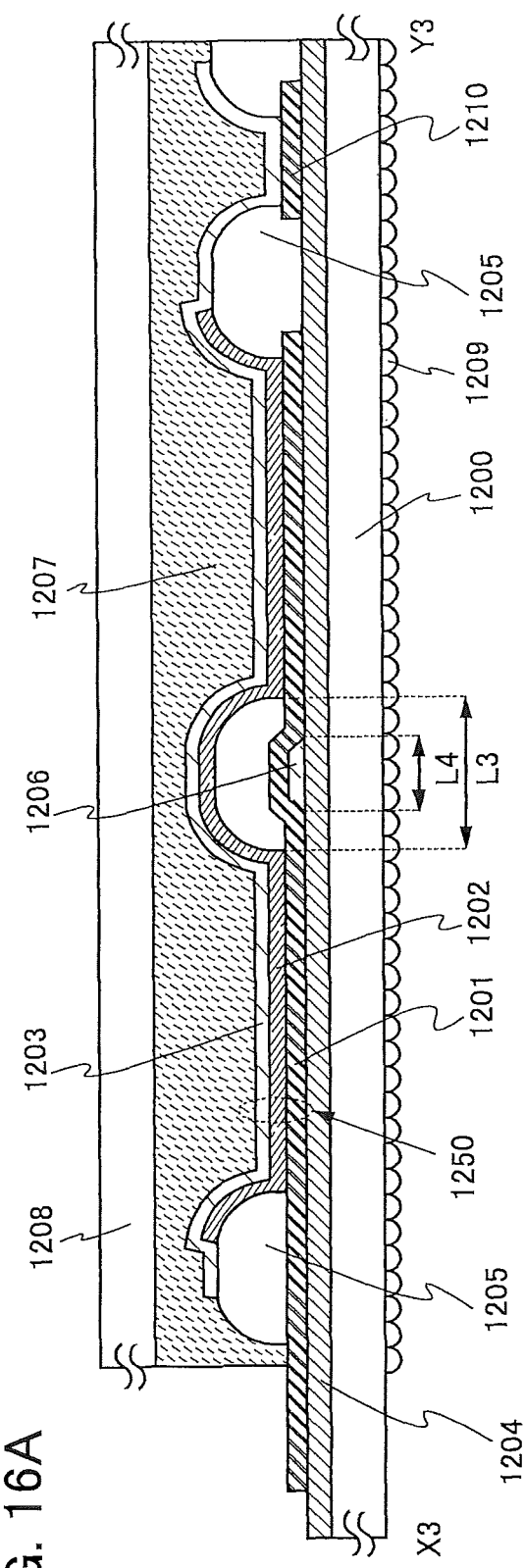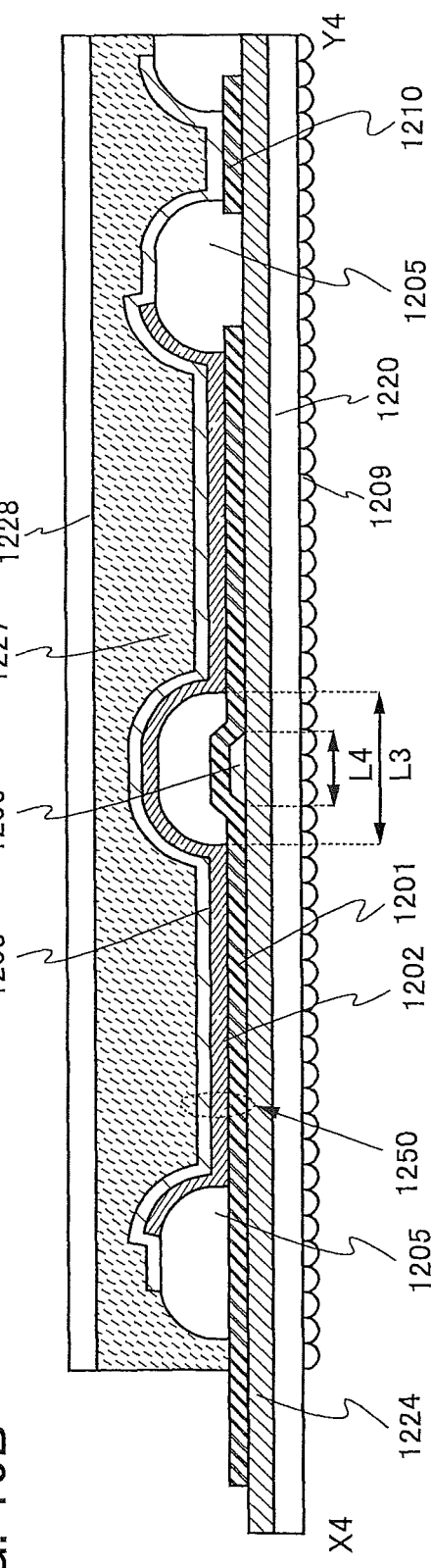

LIGHT-EMITTING DEVICE COMPRISING LIGHT-EMITTING LAYERS

This application is a continuation of U.S. application Ser. No. 14/952,546, filed on Nov. 25, 2015 (now U.S. Pat. No. 9,373,808 issued Jun. 21, 2016) which is a continuation of U.S. application Ser. No. 14/090,241, filed on Nov. 26, 2013 (now U.S. Pat. No. 9,203,045 issued Dec. 1, 2015), which are all incorporated herein by reference.

BACKGROUND OF THE INVENTION

1. Field of the Invention

The present invention relates to, for example, a semiconductor device, a display device, a light-emitting device, a power storage device, a driving method thereof, or a manufacturing method thereof. In particular, one embodiment of the present invention relates to a light-emitting element and a light-emitting device using an electroluminescence (EL) phenomenon, and an electronic device and a lighting device using the light-emitting element and the light-emitting device.

2. Description of the Related Art

In recent years, research and development have been extensively conducted on light-emitting elements utilizing the EL phenomenon. In a basic structure of such a light-emitting element, a layer containing a light-emitting organic compound (hereinafter also referred to as an EL layer) is sandwiched between a pair of electrodes. The light-emitting element utilizing the EL phenomenon has attracted attention as a next-generation flat panel display element owing to characteristics such as feasibility of being thinner and lighter, high-speed response to input signals, and capability of direct current low voltage driving. In addition, a display using such the light-emitting element has a feature that it is excellent in contrast and image quality, and has a wide viewing angle. Further, since such a light-emitting element is a plane light source, application of the light-emitting element as a light source such as a backlight of a liquid crystal display and an illumination device is proposed.

In the case of a light-emitting element in which a layer containing an organic compound used as a light-emitting substance is provided between a pair of electrodes, by applying a voltage to the element, electrons from a cathode and holes from an anode are injected into the layer containing the organic compound and thus a current flows. The injected electrons and holes then lead the organic compound to its excited state, so that light emission is obtained from the excited organic compound.

As the excited state caused by an organic compound, there are a singlet excited state (S*) and a triplet excited state (T*). Light emission generated in a singlet excited state is referred to as fluorescence and light emission generated in a triplet excited state is referred to as phosphorescence. Here, in a compound that emits fluorescence (hereinafter also referred to as a fluorescent compound), in general, phosphorescence is not observed at room temperature, and only fluorescence is observed. Accordingly, the internal quantum efficiency (the ratio of generated photons to injected carriers) of a light-emitting element including the fluorescent compound is assumed to have a theoretical limit of 25% based on the ratio of the singlet excited state to the triplet excited state.

On the other hand, when a compound that emits phosphorescence (hereinafter also referred to as a phosphorescent compound) is used, the internal quantum efficiency can be theoretically increased to 100%. That is, higher emission efficiency can be obtained than using a fluorescent compound. For these reasons, a light-emitting element including a phosphorescent compound has been actively developed in recent years in order to obtain a light-emitting element with high emission efficiency.

As the phosphorescent compound, an organometallic complex that has iridium or the like as a central metal have particularly attracted attention because of their high phosphorescence quantum yield; for example, an organometallic complex that has iridium as a central metal is disclosed as a phosphorescent material in Patent Document 1.

REFERENCE

Patent Document

[Patent Document 1] PCT International Publication No. 00/70655

SUMMARY OF THE INVENTION

Development of a light-emitting element using a phosphorescent compound still leaves room for improvement in terms of emission efficiency, reliability, cost, and the like. Thus, improvement of an element structure, development of a substance, and the like are being carried out.

An object of one embodiment of the present invention is to provide a novel light-emitting element. Another object of one embodiment of the present invention is to provide a novel light-emitting device. Another object of one embodiment of the present invention is to provide a novel electronic device or a novel lighting device.

Another object of one embodiment of the present invention is to provide a light-emitting element with high emission efficiency. Another object of one embodiment of the present invention is to provide a light-emitting device with high emission efficiency. Another object of one embodiment of the present invention is to provide an electronic device or a lighting device with low power consumption. Another object of one embodiment of the present invention is to provide a light-emitting element or the like with a long lifetime. Another object of one embodiment of the present invention is to provide a light-emitting element or the like with high reliability. Another object of one embodiment of the present invention is to provide a non-breakable light-emitting device or the like. Another object of one embodiment of the present invention is to provide a flexible light-emitting device or the like. Another object of one embodiment of the present invention is to provide a light-emitting device or the like with high light extraction efficiency. Another object of one embodiment of the present invention is to provide a lightweight light-emitting device or the like.

Note that the descriptions of these problems do not disturb the existence of other problems. Note that in one embodiment of the present invention, there is no need to achieve all of the objects. Other objects will be apparent from and can be derived from the description of the specification, the drawings, the claims, and the like.

One embodiment of the present invention is a light-emitting element at least including a first electrode, a first light-emitting layer over the first electrode, a second light-emitting layer over and in contact with the first light-emitting layer, a third light-emitting layer over and in contact with the first light-emitting layer, and a second electrode over the third light-emitting layer. One of the first light-emitting layer and the second light-emitting layer contains at least a green-light-emitting phosphorescent compound. The other of the first light-emitting layer and the second light-emitting layer contains at least an orange-light-emitting phosphorescent compound. The third light-emitting layer contains at least a blue-light-emitting hole-trapping fluorescent compound (which easily accepts holes) and an electron-transport compound that disperses the fluorescent compound.

In the light-emitting element, one of the first light-emitting layer and the second light-emitting layer preferably contains a first organic compound that disperses the green-light-emitting phosphorescent compound. In the light-emitting element, the other of the first light-emitting layer and the second light-emitting layer preferably contains a second organic compound that disperses the orange-light-emitting phosphorescent compound. In particular, the first organic compound is preferably the same as the second organic compound.

Note that in this specification, the maximum emission wavelength of the green-light-emitting phosphorescent compound is greater than 500 nm and less than or equal to 570 nm, the maximum emission wavelength of the orange-light-emitting phosphorescent compound is greater than 570 nm and less than or equal to 620 nm, and the maximum emission wavelength of the blue-light-emitting hole-trapping fluorescent compound is less than or equal to 500 nm (note that this wavelength is included in visible light range, e.g., greater than or equal to 400 nm).

Further, in the light-emitting element, the blue-light-emitting hole-trapping fluorescent compound preferably contains a pyrene skeleton. Further, in the light-emitting element, the electron-transport compound that disperses the fluorescent compound preferably contains an anthracene skeleton.

Another embodiment of the present invention is a light-emitting device including the above-described light-emitting element. Another embodiment of the present invention is an electronic device including the light-emitting device in a display portion. Another embodiment of the present invention is a lighting device including the light-emitting device in a light-emitting portion.

Note that the light-emitting device in this specification includes an image display device that uses a light-emitting element. Further, the category of the light-emitting device in this specification includes a module in which a light-emitting element is provided with a connector such as an anisotropic conductive film or a TCP (tape carrier package); a module in which the top of the TCP is provided with a printed wiring board; and a module in which an IC (integrated circuit) is directly mounted on a light-emitting element by a COG (chip on glass) method. Furthermore, light-emitting devices that are used in lighting equipment and the like shall also be included.

According to another embodiment of the present invention, a novel light-emitting element can be provided. According to one embodiment of the present invention, a novel light-emitting device can be provided. According to one embodiment of the present invention, a novel electronic device or a novel lighting device can be provided.

According to one embodiment of the present invention, a light-emitting element having high emission efficiency can be provided. According to one embodiment of the present invention, a light-emitting device with high emission efficiency can be provided. According to one embodiment of the present invention, an electronic device or a lighting device with low power consumption can be provided.

BRIEF DESCRIPTION OF THE DRAWINGS

FIGS. 3A and 3B each illustrate an example of a light-emitting device of one embodiment of the present invention.

FIGS. 11A and 11B illustrate a light-emitting device in Example 1.

FIGS. 16A and 16B illustrate a light-emitting device of Example 2.

DETAILED DESCRIPTION OF THE INVENTION

Figure 1A:
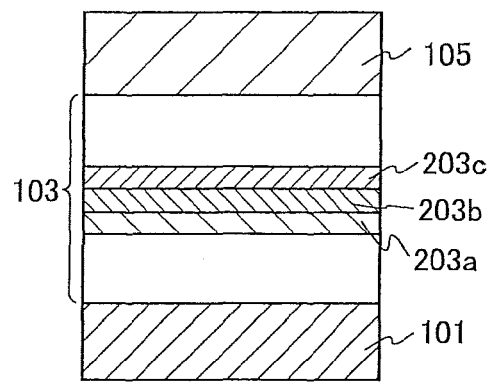
FIGS. 1A to 1D each illustrate an example of a light-emitting element of one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In Embodiment 1, light-emitting elements of embodiment of the present invention will be described with reference to FIGS. 1A to 1D.

<Structure of Light-Emitting Element>

A light-emitting element of one embodiment of the present invention at least includes a first electrode, a first light-emitting layer over the first electrode, a second light-emitting layer over and in contact with the first light-emitting layer, a third light-emitting layer over and in contact with the first light-emitting layer, and a second electrode over the third light-emitting layer. One of the first light-emitting layer and the second light-emitting layer contains at least a green-light-emitting phosphorescent compound. The other of the first light-emitting layer and the second light-emitting layer contains at least an orange-light-emitting phosphorescent compound. The third light-emitting layer contains at least a blue-light-emitting hole-trapping fluorescent compound (which easily accepts holes) and an electron-transport compound that disperses the fluorescent compound.

In the light-emitting element of one embodiment of the present invention, the green-light-emitting phosphorescent compound, the orange-light-emitting phosphorescent compound, and the blue-light-emitting fluorescent compound are used as light-emitting substances. Adjustment of emission balance among the phosphorescent and fluorescent light-emitting layers can increase emission efficiency of the light-emitting element.

In the light-emitting element of one embodiment of the present invention, the electron-transport organic compound is used as a host material of the blue-light-emitting fluorescent compound and is positioned to be the closest to the cathode among the three light-emitting layers; with this structure, light emission from the phosphorescent compounds is easily obtained. Accordingly, the light-emitting element with high emission efficiency is achieved.

Although light emitted from a fluorescent compound is weaker than that from a phosphorescent compound, one embodiment of the present invention is preferable particularly in the case where a strong blue emission is unnecessary and high emission efficiency is required, for example, for a warm-white light-emitting device used as lighting.

In order to obtain a highly efficient light-emitting element, the following have been proposed: a tandem light-emitting element in which a plurality of EL layers is stacked with a charge generation region sandwiched therebetween, and a light-emitting element whose light-emitting substances are all phosphorescent compounds. The kind and the number of films included in the light-emitting element of one embodiment of the present invention are less than those of a tandem light-emitting element. Therefore, a highly efficient light-emitting element can be manufactured in a short manufacturing process at low cost. In addition, the lifetime of a blue-light-emitting fluorescent compound is longer than that of a blue-light-emitting phosphorescent compound; thus, a highly reliable light-emitting element can be achieved in one embodiment of the present invention.

A light-emitting element shown in FIG. 1A includes a first electrode 101, an EL layer 103 over the first electrode 101, and a second electrode 105 over the EL layer 103. In this embodiment, the first electrode 101 serves as an anode, and the second electrode 105 serves as a cathode.

When a voltage higher than the threshold voltage of the light-emitting element is applied between the first electrode 101 and the second electrode 105, holes are injected to the EL layer 103 from the first electrode 101 side and electrons are injected to the EL layer 103 from the second electrode 105 side. The injected electrons and holes are recombined in the EL layer 103 and a light-emitting substance contained in the EL layer 103 emits light.

The EL layer 103 includes a first light-emitting layer 203a, a second light-emitting layer 203b over and in contact with the first light-emitting layer 203a, and a third light-emitting layer 203c over and in contact with the second light-emitting layer 203b. One of the first light-emitting layer 203a and the second light-emitting layer 203b contains a green-light-emitting phosphorescent compound, and the other thereof contains an orange-light-emitting phosphorescent compound. The third light-emitting layer 203c contains a blue-light-emitting hole-trapping fluorescent compound and an electron-transport compound which disperses the fluorescent compound. Either a low molecular compound or a high molecular compound can be used for the EL layer 103, and an inorganic compound may also be contained.

The EL layer 103 may further include, as a layer other than the light-emitting layers, a layer containing a hole-injection substance or an electron-injection substance, a hole-transport substance or an electron-transport substance, a bipolar substance (i.e., a substance in which the electron-transport property and the hole-transport property are high), and the like.

Figure 1B:
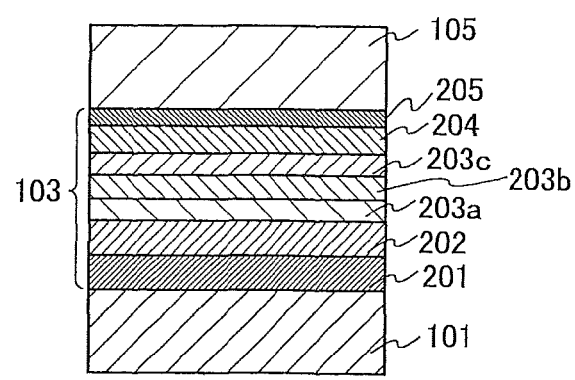

A light-emitting element shown in FIG. 1B includes a hole-injection layer 201 over the first electrode 101 and between the first electrode 101 and the first light-emitting layer 203a, and a hole-transport layer 202 over the hole-injection layer 201. Further, an electron-transport layer 204 over and in contact with the third light-emitting layer 203c, and an electron-injection layer 205 over and in contact with the electron-transport layer 204 are included between the third light-emitting layer 203c and the second electrode 105. Note that the first light-emitting layer 203a, the second light-emitting layer 203b, and the third light-emitting layer 203c contain materials similar to those in FIG. 1A.

Figure 1C:
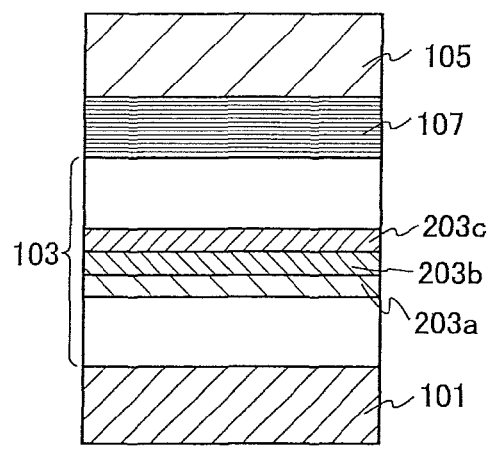

A light-emitting element shown in FIG. 1C includes the first electrode 101, the EL layer 103 over the first electrode 101, an interlayer 107 over the EL layer 103, and the second electrode 105 over the interlayer 107. The EL layer 103 has the same structure as that in FIG. 1A.

Figure 1D:
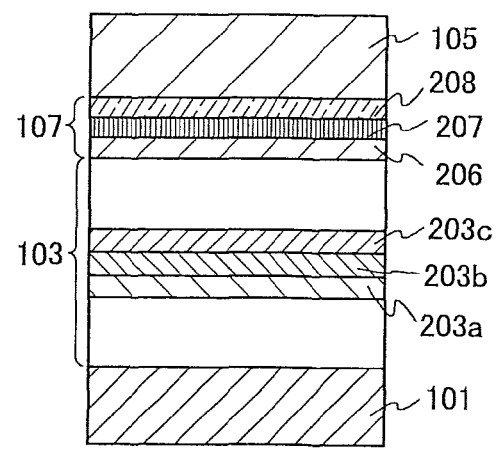

A specific example of the structure of the interlayer 107 is shown in FIG. 1D. The interlayer 107 includes at least a charge generation region 208 that is in contact with the second electrode 105. In addition to the charge-generation region 208, the interlayer 107 may further include an electron-relay layer 207 and an electron-injection buffer layer 206.

A light-emitting element shown in FIG. 1D includes the first electrode 101, the EL layer 103 over the first electrode 101, the interlayer 107 over the EL layer 103, and the second electrode 105 over the interlayer 107. The interlayer 107 includes the electron-injection buffer layer 206, the electron-relay layer 207 over the electron-injection buffer layer 206, and the charge generation region 208 over the electron-relay layer 207 and in contact with the second electrode 105. The structure of the EL layer 103 is the same as that of FIG. 1A.

When a voltage higher than the threshold voltage of the light-emitting element is applied between the first electrode 101 and the second electrode 105, holes and electrons are generated in the charge-generation region 208, and the holes move into the second electrode 105 and the electrons move into the electron-relay layer 207. The electron-relay layer 207 has a high electron-transport property and immediately transfers the electrons generated in the charge-generation region 208 to the electron-injection buffer layer 206. The electron-injection buffer layer 206 reduces a barrier against electron injection into the EL layer 103, so that the efficiency of the electron injection into the EL layer 103 can be improved. Thus, the electrons generated in the charge-generation region 208 are injected into the lowest unoccupied molecular orbital (LUMO) level of the EL layer 103 through the electron-relay layer 207 and the electron-injection buffer layer 206.

In addition, the electron-relay layer 207 can prevent interaction in which the substance included in the first charge generation region 208 and the substance included in the electron-injection buffer layer 206 react with each other at the interface therebetween to damage the functions of the first charge generation region 208 and the electron-injection buffer layer 206.

<Materials of Light-Emitting Element>

Examples of materials which can be used for each layer will be described below. Note that each layer is not limited to a single layer, but may be a stacked-layer of two or more layers.

<Anode>

The electrode serving as the anode (the first electrode 101 in this embodiment) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride). Alternatively, the electrode may be formed as follows: silver, copper, aluminum, titanium, or the like is formed to have a nanowire shape (or a thin-stripe shape), and then a conductive substance (a conductive organic material, graphene, or the like) is formed thereover by a coating method, a printing method, or the like.

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 105 in this embodiment) can be formed using one or more kinds of conductive metals and alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that in the case where the cathode is in contact with the charge-generation region, a variety of conductive materials can be used regardless of its work function. For example, ITO, silicon, or indium tin oxide containing silicon oxide can be used.

The electrodes each can be formed by a vacuum evaporation method or a sputtering method. Alternatively, when silver paste or the like is used, a coating method or an inkjet method can be used.

In addition, an insulating film such as an organic film, a transparent semiconductor film, or a silicon nitride film may be formed over the cathode (also referred to as an upper electrode). These films serve as passivation films and can suppress the entrance of impurities and moisture into the light-emitting element, or can reduce loss of light energy due to surface plasmon in the cathode.

<Light-Emitting Layer>

As described above, the light-emitting element of one embodiment of the present invention includes a light-emitting layer containing a green-light-emitting phosphorescent compound, a light-emitting layer containing an orange-light-emitting phosphorescent compound, and a light-emitting layer containing a blue-light-emitting hole-trapping fluorescent compound and an electron-transport compound that disperses the fluorescent compound.

The phosphorescent compounds and the fluorescent compound can be referred to as guest materials in respective light-emitting layers. The electron-transport compound that disperses the fluorescent compound can be referred to as a host material. The light-emitting layer containing a green-light-emitting phosphorescent compound and the light-emitting layer containing an orange-light-emitting phosphorescent compound may each contain an organic compound that disperses the phosphorescent compound (host material). Each of the light-emitting layers may further contain a material other than the guest material and the host material.

The guest material is preferably dispersed in the host material. When the light-emitting layer has the structure in which the guest material is dispersed in the host material, the crystallization of the light-emitting layer can be inhibited. Further, concentration quenching due to high concentration of the guest material can be suppressed and thus the light-emitting element can have high emission efficiency. An electron-transport compound and a hole-transport compound, which are described below, can be used as the host materials. In particular, an electron-transport compound is used for the third light-emitting layer 203c.

Note that the $T_1$ level of the host material (or a material other than the guest material in the light-emitting layer) is preferably higher than the $T_1$ level of the guest material. This is because, when the $T_1$ level of the host material is lower than that of the guest material, the triplet excitation energy of the guest material, which is to contribute to light emission, is quenched by the host material and accordingly the emission efficiency is decreased.

Examples of the phosphorescent compound that emits orange light or green light include the following: an organometallic iridium complex having a pyrimidine skeleton such as (acetylacetonato)bis(4,6-diphenylpyrimidinato) iridium(III) (abbreviation: [Ir(dppm)$_2$(acac)]), (acetylacetonato)bis(6-tert-butyl-4-phenylpyrimidinato)iridium(III) (abbreviation: [Ir(tBuppm)$_2$(acac)]), tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis[4-(2-norbornyl)-6-phenylpyrimidinato]iridium(III) (mixture of endo- and exo-) (abbreviation: [Ir(nbppm)$_2$(acac)]); an organometallic iridium complex having a pyrazine skeleton such as (acetylacetonato)bis(3,5-dimethyl-2-phenylpyrazinato) iridium(III) (abbreviation: [Ir(mppr-Me)$_2$(acac)]), and (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton such as tris(2-phenylpyridinato-N,C$^{2'}$)iridium(III) (abbreviation: Ir(ppy)$_3$), bis[2-phenylpyridinato-N,C$^{2'}$]iridium(III) acetylacetonate (abbreviation: [Ir(ppy)$_2$(acac)]), bis(benzo[h]quinolinato)iridium(III)acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)

iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); an organometallic iridium complex in which a phenylpyridine derivative having an electron-withdrawing group is a ligand, such as bis[2-(3',5'-bistrifluoromethylphenyl)pyridinato-N,C$^{2'}$]iridium(III)picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIracac); and a rare earth metal complex such as tris(acetylacetonato) (monophenanthroline)terbium(III) (Tb(acac)$_3$(Phen)).

Examples of the blue-light-emitting hole-trapping fluorescent compound include N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA). A fluorescent compound having a pyrene skeleton is particularly preferable because of their high hole-trapping properties, high emission efficiency, and high reliability. In addition, condensed aromatic diamine compounds typified by pyrenediamine compounds such as 1,6FLPAPrn and 1,6mMemFLPAPrn are particularly preferable because of their high hole-trapping properties, high emission efficiency, and high reliability.

As the electron-transport compound, a π-electron deficient heteroaromatic compound such as a nitrogen-containing heteroaromatic compound, a metal complex having a quinoline skeleton or a benzoquinoline skeleton, a metal complex having an oxazole-based or thiazole-based ligand, or the like can be used.

Specific examples include the following: metal complexes such as bis(10-hydroxybenzo[h]quinolinato)berylium (abbreviation: BeBq$_2$), bis(2-methyl-8-quinolinolato)(4-phenylphenolato)aluminum (abbreviation: BAlq), bis(8-quinolinolato)zinc(II) (abbreviation: Znq), bis[2-(2-hydroxyphenyl)benzoxazolato]zinc (abbreviation: Zn(BOX)$_2$), and bis[2-(2-hydroxyphenyl)benzothiazolato]zinc (abbreviation: Zn(BTZ)$_2$); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]-quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), and 2-[3'-(9H-carbazol-9-yl)biphenyl-3-yl]-dibenzo quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]-pyrimidine (abbreviation: 4,6mPnP2Pm), 4,6-bis[3-(9H-carbazol-9-yl)phenyl]pyrimidine (abbreviation: 4,6mCzP2Pm), and 4,6-bis[3-(4-dibenzothienyl)phenyl]-pyrimidine (abbreviation: 4,6mDBTP2Pm-II); heterocyclic compounds having pyridine skeletons, such as 3,5-bis[3-(9H-carbazol-9-yl)phenyl]-pyridine (abbreviation: 3,5DCzPPy), 1,3,5-tri[3-(3-pyridyl)phenyl]benzene (abbreviation: TmPyPB), and 3,3',5,5'-tetra[(m-pyridyl)-phen-3-yl]biphenyl (abbreviation: BP4mPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have favorable reliability and can preferably be used.

The following examples can also be given: metal complexes having quinoline skeletons or benzoquinoline skeletons, such as tris(8-quinolinolato)aluminum (abbreviation: Alq) and tris(4-methyl-8-quinolinolato)aluminum (abbreviation: Almq$_3$); and heteroaromatic compounds such as bathophenanthroline (abbreviation: BPhen), bathocuproine (abbreviation: BCP), 3-(4-tert-butylphenyl)-4-(4-ethylphenyl)-5-(4-biphenylyl)-1,2,4-triazole (abbreviation: p-EtTAZ), and 4,4'-bis(5-methylbenzoxazol-2-yl)stilbene (abbreviation: BzOs). In addition, high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can also be given.

Further, an electron-transport compound which easily accepts holes such as 9-[4-(10-phenyl-9-anthracenyl)phenyl]-9H-carbazole (abbreviation: CzPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviated to DPCzPA), 9,10-bis(3,5-diphenylphenyl)anthracene (abbreviation: DPPA), 9,10-di(2-naphthyl)anthracene (abbreviation: DNA), and 2-tert-butyl-9,10-bis(4-phenylphenyl)anthracene (abbreviation: t-BuDBA) can be preferably used. In the light-emitting element of one embodiment of the present invention, the electron-transport compound that disperses the blue-light-emitting hole-trapping fluorescent compound preferably has an anthracene skeleton to have a hole-trapping property in addition to an electron-transport property.

Examples of a hole-transport compound include a π-electron rich heteroaromatic compound (e.g., a carbazole derivative or an indole derivative), an aromatic amine compound, and the like.

Specifically, the following examples can be given: 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)-triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-N',N'-diphenylamino-9H-fluoren-7-yl)-N',N'-diphenylamine (abbreviation: DPNF), N,N',N''-triphenyl-N,N',N''-tris(9-phenylcarbazol-3-yl)benzene-1,3,5-triamine (abbreviation:

PCA3B), 2-[N-(9-phenylcarbazol-3-yl)-N-phenylamino]-spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N, N'-diphenyl-9,9-dimethylfluorene-2,7-diamine (abbreviation: YGA2F), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(4-diphenylaminophenyl)-N-phenylamino]-9-phenylearbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]-phenyl}-N-phenylamino)biphenyl (abbreviation: DNTPD), and 3,6-bis[N-(4-diphenylaminophenyl)-N-(1-naphthyl)amino]-9-phenylcarbazole (abbreviation: PCzTPN2).

The following examples can also be given: aromatic amine compounds such as 4,4'-bis[N-(1-naphthyl)-N-phenylamino]biphenyl (abbreviation: NPB or α-NPD), 4,4',4"-tris(N,N-diphenylamino)triphenylamine (abbreviation: TDATA), 4,4',4"-tris[N-(3-methylphenyl)-N-phenylamino]-triphenylamine (abbreviation: MTDATA), 4,4'-bis[N-(spiro-9, 9'-bifluoren-2-yl)-N-phenylamino]-biphenyl (abbreviation: BSPB), 4,4',4"-tris(N-carbazolyl)triphenylamine (abbreviation: TCTA), 4-phenyl-4'-(9-phenylfluoren-9-yl) triphenylamine (abbreviation: BPAFLP), and 4,4'-bis[N-(9, 9-dimethylfluoren-2-yl)-N-phenylamino]-biphenyl (abbreviation: DFLDPBi); and carbazole derivatives such as 4,4'-di(N-carbazolyl)biphenyl (abbreviation: CBP), CzPA, and PCzPA. In addition, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]-phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD) can be given.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side).

However, in the case of a general phosphorescent guest material, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, it is preferable that in a light-emitting layer of a light-emitting element of one embodiment of the present invention, which uses a phosphorescent compound as a guest material, a third substance be contained in addition to the phosphorescent compound and the host material (which are respectively regarded as a first substance and a second substance contained in the light-emitting layer), and a combination of the host material the third substance form an exciplex (also referred to as excited complex). In that case, the host material and the third substance form an exciplex at the time of recombination of carriers (electrons and holes) in the light-emitting layer. Thus, in the light-emitting layer, fluorescence spectra of the host material and the third substance are converted into an emission spectrum of the exciplex which is located on a longer wavelength side. Moreover, when the host material and the third substance are selected such that the emission spectrum of the exciplex has a large overlap with the absorption spectrum of the guest material, energy transfer from a singlet excited state can be maximized. Note that also in the case of a triplet excited state, energy transfer from the exciplex, not the host material, is assumed to occur. In one embodiment of the present invention to which such a structure is applied, energy transfer efficiency can be improved owing to energy transfer utilizing an overlap between an emission spectrum of an exciplex and an absorption spectrum of a phosphorescent compound; accordingly, a light-emitting element with high external quantum efficiency can be provided.

Although any combination of the host material and the third substance can be used as long as an exciplex is formed, an electron-trapping compound (a compound that easily accepts electrons) and a hole-trapping compound are preferably combined.

For example, as the host material and the third substance, the electron-trap compound and the hole-trapping compound among the above-described electron-transport compound or hole-transport compounds can be used.

The materials which can be used as the host material or the third substance are not limited to the above materials as long as a combination of the material used as the host material and the material used as the third substance can form an exciplex, an emission spectrum of the exciplex overlaps with an absorption spectrum of the guest material, and a peak of the emission spectrum of the exciplex is located on a longer wavelength side than a peak of the absorption spectrum of the guest material.

Note that when an electron-trapping compound and a hole-trapping compound are used for the host material and the third substance, carrier balance can be controlled by the mixture ratio of the compounds. Specifically, the ratio of the host material to the third substance is preferably from 1:9 to 9:1.

Further, the exciplex may be formed at the interface between two layers. For example, when a layer containing the electron-trapping compound and a layer containing the hole-trapping compound are stacked, the exciplex is formed in the vicinity of the interface thereof. These two layers may be used as the light-emitting layer in the light-emitting element of one embodiment of the present invention. These two layers may be used as the light-emitting layer in one embodiment of the present invention. The phosphorescent compound may be added to one of the two layers or both.

<Hole-Transport Layer>

The hole-transport layer 202 is a layer that contains a hole-transport substance.

The hole-transport substance is preferably a substance with a property of transporting more holes than electrons, and is especially preferably a substance with a hole mobility of $10^{-6}$ cm$^2$/Vs or more.

For the hole-transport layer 202, it is possible to use any of the hole-transport compound that are described as examples of the substance applicable to the light-emitting layer.

Further, an aromatic hydrocarbon compound such as CzPA, t-BuDNA, DNA, or DPAnth can be used.

<Electron-Transport Layer>

The electron-transport layer 204 contains an electron-transport substance.

The electron-transport substance is preferably an organic compound having a property of transporting more electrons than holes, and is especially preferably a substance with an electron mobility of $10^{-6}$ cm$^2$/Vs or more.

For the electron-transport layer 204, it is possible to use any of the electron-transport compounds that are described as examples of the substance applicable to the light-emitting layer.

<Hole-Injection Layer>

The hole-injection layer 201 is a layer containing a hole-injection substance.

Examples of the hole-injection substance include metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

A phthalocyanine-based compound such as phthalocyanine (abbreviation: H$_2$Pc), or copper(II) phthalocyanine (abbreviation: CuPc) can also be used.

Further alternatively, it is possible to use an aromatic amine compound which is a low molecular organic compound, such as TDATA, MTDATA, DPAB, DNTPD, 1,3,5-tris[N-(4-diphenylaminophenyl)-N-phenylamino]benzene (abbreviation: DPA3B), PCzPCA1, PCzPCA2, or PCzPCN1.

Further alternatively, it is possible to use a high molecular compound such as PVK, PVTPA, PTPDMA, or Poly-TPD, or a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS).

The hole-injection layer 201 may serve as the charge-generation region. When the hole-injection layer 201 in contact with the anode serves as the charge-generation region, a variety of conductive materials can be used for the anode regardless of their work functions. Materials contained in the charge-generation region will be described later.

<Electron-Injection Layer>

The electron-injection layer 205 contains an electron-injection substance.

Examples of the electron-injection substance include an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride.

The electron-injection layer 205 may serve as the charge-generation region. When the electron-injection layer 205 in contact with the cathode serves as the charge-generation region, any of a variety of conductive materials can be used for the cathode regardless of their work functions. Materials contained in the charge-generation region will be described later.

<Charge-Generation Region>

A charge-generation region included in a hole-injection layer or an electron-injection layer and the charge-generation region 208 may have either a structure in which an electron acceptor (acceptor) is added to a hole-transport substance or a structure in which an electron donor (donor) is added to an electron-transport substance. Alternatively, these structures may be stacked.

The hole-transport compounds and the electron-transport compounds which are described as examples of the substance that can be used for a light-emitting layer can be given as the hole-transport substance and the electron-transport substance.

Further, as the electron acceptor, 7,7,8,8-tetracyano-2,3,5,6-tetrafluoroquinodimethane (abbreviation: F$_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

Further, as the electron donor, it is possible to use an alkali metal, an alkaline earth metal, a rare earth metal, a metal belonging to Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

<Electron-Injection Buffer Layer>

The electron-injection buffer layer 206 contains an electron-injection substance. The electron-injection buffer layer 206 is a layer that facilitates electron injection from the charge generation region 208 into the EL layer 103. As the high electron-injection substance, any of the above-described substances can be used. Alternatively, the electron-injection buffer layer 206 may contain any of the above-described electron-transport substances and donor substances.

<Electron-Relay Layer>

The electron-relay layer 207 immediately accepts electrons drawn out of the acceptor substance in the charge-generation region 208.

The electron-relay layer 207 contains an electron-transport substance. As the electron-transport substance, a phthalocyanine-based material or a metal complex having a metal-oxygen bond and an aromatic ligand is preferably used.

As the phthalocyanine-based substance, specifically, it is possible to use CuPc, a phthalocyanine tin(II) complex (SnPc), a phthalocyanine zinc complex (ZnPc), cobalt(II) phthalocyanine, b-form (CoPc), phthalocyanine iron (FePc), or vanadyl 2,9,16,23-tetraphenoxy-29H, 31H-phthalocyanine (PhO-VOPc).

As the metal complex having a metal-oxygen bond and an aromatic ligand, a metal complex having a metal-oxygen double bond is preferably used. A metal-oxygen double bond has an acceptor property; thus, electrons can transfer (be donated and accepted) more easily.

As the metal complex having a metal-oxygen bond and an aromatic ligand, a phthalocyanine-based material is also preferably used. In particular, vanadyl phthalocyanine (VOPc), a phthalocyanine tin(IV) oxide complex (SnOPc), or a phthalocyanine titanium oxide complex (TiOPc) is preferable because a metal-oxygen double bond is more likely to act on another molecule in terms of a molecular structure and an acceptor property is high.

As the phthalocyanine-based material, a phthalocyanine-based material having a phenoxy group is preferably used. Specifically, a phthalocyanine derivative having a phenoxy group, such as PhO-VOPc, is preferably used. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

Examples of other electron-transport substances include perylene derivatives such as 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like. Alternatively, it is possible to use a nitrogen-containing condensed aromatic compound such as pirazino[2,3-f][1,10]-phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), or 2, 3-bis(4-fluorophenyl)pyrido[2,3-b]-pyrazine (abbreviation: F2PYPR). The nitrogen-containing condensed aromatic compound is preferably used for the electron-relay layer 207 because of its stability.

Further alternatively, it is possible to use 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), or a methanofullerene (e.g., [6,6]-phenyl C$_{61}$ butyric acid methyl ester).

The electron-relay layer 207 may further contain any of the above-described donor materials. When the donor material is contained in the electron-relay layer 207, electrons can transfer easily and the light-emitting element can be driven at a lower voltage.

The LUMO levels of the substance with a high electron-transport property and the donor substance are preferably −5.0 eV to −3.0 eV, i.e., between the LUMO level of the acceptor substance contained in the charge-generation region 208 and the LUMO level of the substance with a high electron-transport property contained in the electron-transport layer 204 (or the LUMO level of the EL layer 103 in contact with the electron-relay layer 207 or with the electron-injection buffer layer 206). When a donor substance is contained in the electron-relay layer 207, as the electron-transport substance, a substance with a LUMO level higher than the acceptor level of the acceptor substance contained in the charge-generation region 208 can be used.

The above-described layers included in the EL layer 103 and the intermediate layer 107 can be formed separately by any of the following methods: an evaporation method (including a vacuum evaporation method), a transfer method, a printing method, an inkjet method, a coating method, and the like.

With the use of a light-emitting element described in this embodiment, a passive matrix light-emitting device or an active matrix light-emitting device in which driving of the light-emitting element is controlled by a transistor can be manufactured. Furthermore, the light-emitting device can be applied to an electronic device, a lighting device, or the like.

This embodiment can be freely combined with other embodiments.

Embodiment 2

Figure 2:
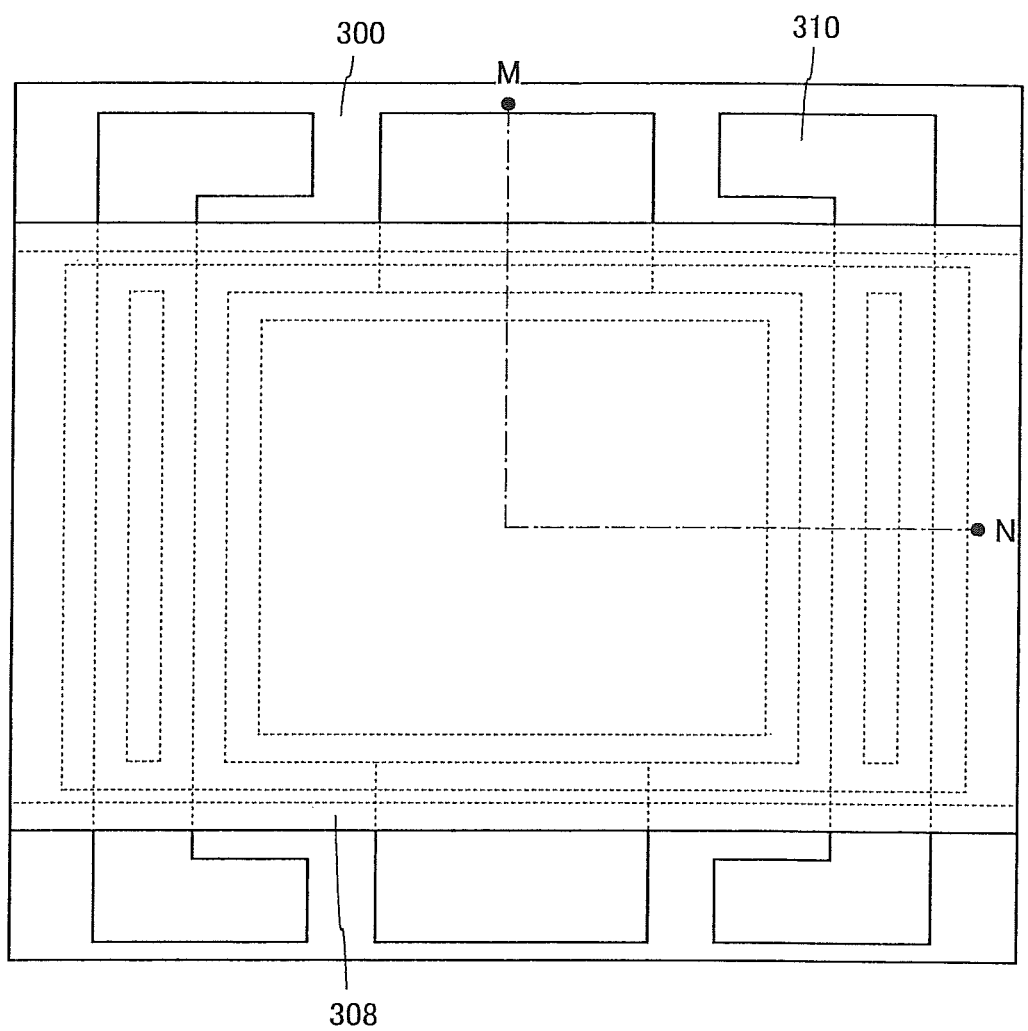
FIG. 2 illustrates an example of a light-emitting device of one embodiment of the present invention.

In this embodiment, a light-emitting device of one embodiment of the present invention will be described with reference to FIG. 2 and FIGS. 3A and 3B. FIGS. 3A and 3B are cross-sectional views taken along chain line M-N in FIG. 2.

The light-emitting device including a light-emitting element of one embodiment of the present invention has high emission efficiency. In addition, the light-emitting element one embodiment of the present invention can be favorably used in a flexible light-emitting device.

The light-emitting device in FIG. 3A includes a top-emission light-emitting element 350 over a supporting substrate 300 with an insulating film 304 provided therebetween. The light-emitting element 350 includes a first electrode 301, an EL layer 302, and a second electrode 303. The second electrode 303 has a transmitting property with respect to visible light. An end portion of the first electrode 301 and an end portion of a terminal 310 are covered with a partition wall 305. An auxiliary wiring 306 is provided over the first electrode 301 with the partition wall 305 provided therebetween. The auxiliary wiring 306 is electrically connected to the second electrode 303. The supporting substrate 300 and a sealing substrate 308 are attached to each other with a sealing material 307. A light extraction structure 309 is provided over a surface of the sealing substrate 308.

The light-emitting device in FIG. 3B includes a top-emission light-emitting element 360 over the supporting substrate 300 with the insulating film 304 provided therebetween. The light-emitting element 360 includes a first electrode 321, an EL layer 322, and a second electrode 323. The first electrode 321 has a transmitting property with respect to visible light. An end portion of the first electrode 321 and the end portion of the terminal 310 are covered with the partition wall 305. The auxiliary wiring 306 is provided over the first electrode 321. The partition wall 305 is provided to cover the auxiliary wiring 306. The auxiliary wiring 306 is electrically connected to the first electrode 321. The supporting substrate 300 and the sealing substrate 308 are attached to each other with the sealing material 307. The light extraction structure 309 is provided over a surface of the supporting substrate 300.

Examples of materials that can be used for the light-emitting device of one embodiment of the present invention will be described.

[Substrate]

The substrate on the side from which light from the light-emitting element is extracted is formed using a material which transmits the light. For example, a material such as glass, quartz, ceramics, sapphire, or an organic resin can be used. The substrate of a flexible light-emitting device is formed using a flexible material.

As the glass, for example, non-alkali glass, barium borosilicate glass, aluminoborosilicate glass, or the like can be used.

Examples of a material having flexibility and a light-transmitting property with respect to visible light include flexible glass, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a light-emitting device using this substrate can also be lightweight.

Furthermore, since the substrate through which light emission is not extracted does not need to have a light-transmitting property, a metal substrate using a metal material or an alloy material or the like can be used in addition to the above-mentioned substrates. A metal material and an alloy material, which have high thermal conductance, are preferred in that they can easily conduct heat into the whole sealing substrate and accordingly can reduce a local rise in the temperature of the light-emitting device. To obtain flexibility and bendability, the thickness of a metal substrate is preferably greater than or equal to 10 µm and less than or equal to 200 µm, more preferably greater than or equal to 20 µm and less than or equal to 50 µm.

There is no particular limitation on a material of the metal substrate, but it is preferable to use, for example, aluminum, copper, nickel, a metal alloy such as an aluminum alloy or stainless steel.

It is preferable to use a substrate subjected to insulation treatment in such a manner that a surface of the conductive substrate is oxidized or an insulating film is formed on the surface. An insulating film may be formed by, for example, a coating method such as a spin-coating method and a dipping method, an electrodeposition method, an evaporation method, or a sputtering method. An oxide film may be formed over the substrate surface by a known method such as an anodic oxidation method, exposing to or heating in an oxygen atmosphere, or the like.

The flexible substrate may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the light-emitting element due to moisture and the like, an insulating film with low water permeability may be provided. For example, a film containing nitrogen and silicon (e.g., a silicon nitride film, a silicon oxynitride film), or a film containing nitrogen and aluminum (e.g., an aluminum nitride film) may be provided.

The substrate may be formed by stacking a plurality of layers. When a glass layer is used, a barrier property against water and oxygen can be improved and thus a reliable light-emitting device can be provided.

A substrate in which a glass layer, a bonding layer, and an organic resin layer are stacked from the side closer to a light-emitting element is preferably used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. The thickness of the organic resin layer is greater than or equal to 10 µm and less than or equal to 200 µm, preferably greater than or equal to 20 µm and less than or equal to 50 µm. By providing such an organic resin layer on an outer side than the glass layer, occurrence of a crack or a break in the glass layer can be suppressed and mechanical strength can be improved. With the substrate that includes such a composite material of a glass material and an organic resin, a highly reliable and flexible light-emitting device can be provided.

[Insulating Film]

An insulating film may be provided between the supporting substrate and the light-emitting element. The insulating film can be formed using an inorganic insulating material such as silicon oxide, silicon nitride, silicon oxynitride, or silicon nitride oxide. In order to suppress the entrance of moisture or the like into the light-emitting element, an insulating film with low water permeability such as a silicon oxide film, a silicon nitride film, or an aluminum oxide film is particularly preferable. For a similar purpose and with a similar material, an insulating film covering the light-emitting element may be provided.

[Light-Emitting Element]

The light emitting device of one embodiment of the present invention includes at least one the light emitting elements described in Embodiment 1.

[Partition Wall]

For the partition wall, an organic resin or an inorganic insulating material can be used. As the organic resin, for example, a polyimide resin, a polyamide resin, an acrylic resin, a siloxane resin, an epoxy resin, a phenol resin, or the like can be used. As the inorganic insulating material, silicon oxide, silicon oxynitride, or the like can be used. In particular, a photosensitive resin is preferably used for easy formation of the partition wall.

There is no particular limitation on the method for for ring the partition wall. A photolithography method, a sputtering method, an evaporation method, a droplet discharging method (e.g., an inkjet method), a printing method (e.g., a screen printing method or an offset printing method), or the like can be used.

[Auxiliary Wiring]

An auxiliary wiring is not necessarily provided; however, an auxiliary wiring is preferably provided because voltage drop due to the resistance of an electrode can be prevented.

For a material of the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy material including any of these materials as its main component is used. In that case, in order to prevent the above problem of corrosion, a stacked layer is formed and aluminum is used for a layer which is not in contact with ITO or the like. The thickness of the auxiliary wiring can be greater than or equal to 0.1 µm and less than or equal to 3 µm, preferably greater than or equal to 0.1 µm and less than or equal to 0.5 µm.

Metal paste (e.g., silver paste) may be used for the material of the auxiliary wiring. In this case, the auxiliary wiring can be formed of gathered particles of the metal. Therefore, the surface of the auxiliary wiring is rough and it is difficult for the EL layer to completely cover the auxiliary wiring; accordingly, the upper electrode and the auxiliary wiring are easily connected electrically to each other.

[Sealing Material]

A method for sealing the light-emitting device is not limited, and either solid sealing or hollow sealing can be employed. For example, a glass material such as a glass fit, or a resin material such as a two-component-mixture-type resin which is curable at room temperature, a light curable resin, a thermosetting resin, and the like can be used. The light-emitting device may be filled with an inert gas such as nitrogen or argon, or resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin. Further, a drying agent may be contained in the resin.

[Light Extraction Structure]

For the light extraction structure, a hemispherical lens, a micro lens array, a film provided with an uneven surface structure, a light diffusing film, or the like can be used. For example, a light extraction structure 309 can be formed by attaching the lens or film to the substrate with an adhesive or the like which has substantially the same refractive index as the substrate or the lens or film.

[Transistor]

The light-emitting device of one embodiment of the present invention may include a transistor. The structure of the transistor is not limited: a top-gate transistor may be used, or a bottom-gate transistor such as an inverted staggered transistor may be used. An n-channel transistor may be used and a p-channel transistor may also be used. In addition, there is no particular limitation on a material used for the transistor. For example, a transistor in which silicon or an oxide semiconductor such as an In—Ga—Zn-based metal oxide is used in a channel formation region can be employed.

This embodiment can be freely combined with other embodiments.

Embodiment 3

In this embodiment, an example of a method for manufacturing a light-emitting device, according to one embodiment of the present invention will be described with reference to FIGS. 4A to 4E and FIGS. 5A to 5E. The light-emitting device of this embodiment is a flexible light-emitting device manufactured by a technique in which some elements of the light-emitting device are formed over a formation substrate, and then the elements are transferred from the formation substrate to a flexible substrate.

When a material which is flexible but has high water permeability and low heat resistance (e.g., resin) has to be used for a substrate of a flexible light-emitting device, the substrate can not be exposed to high temperature in the manufacturing process. Thus, conditions for manufacturing a transistor and an insulating film over the substrate are limited. In the manufacturing method of this embodiment, a transistor and the like can be formed over a formation substrate having high heat resistance; thus, a highly reliable transistor and an insulating film whose water permeability is sufficiently reduced can be formed. Then, these are transferred to a flexible substrate and thus a highly reliable flexible light-emitting device can be manufactured.

<Method A for Manufacturing Light-Emitting Device>

Figure 4A:
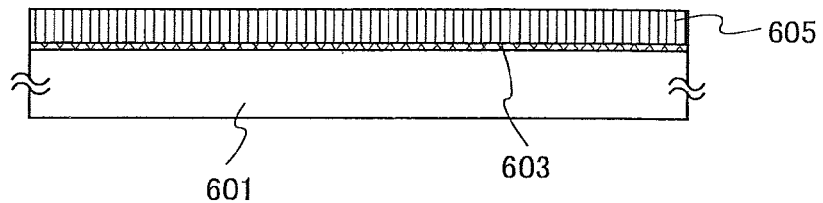
FIGS. 4A to 4E illustrate an example of a method for manufacturing a light-emitting device of one embodiment of the present invention.

First, a separation layer 603 is formed over a formation substrate 601, and a layer 605 to be separated (hereinafter referred to as layer 605) is formed over the separation layer 603 (FIG. 4A).

There is no particular limitation on a layer formed as the layer 605. For example, an insulating film with low water permeability, a transistor, a light-emitting element, a color filter, and the like are given. For example, an insulating film with low water permeability, a transistor, an insulating film covering the transistor, a planarization film, a lower electrode of the light-emitting element, and a partition wall covering an end portion of the lower electrode can be formed as the layer 605. Further, an EL layer and an upper electrode of the light-emitting element, a sealing film covering the light-emitting element and the like may be provided in the layer 605. Alternatively, only an insulating film with low water permeability may be formed as the layer 605, and a transistor and the like may be formed after the separation and transfer process.

A glass substrate, a quartz substrate, a sapphire substrate, a ceramic substrate, a metal substrate, or the like can be used as the formation substrate 601.

For the glass substrate, for example, a glass material such as aluminosilicate glass, aluminoborosilicate glass, or barium borosilicate glass can be used. When the temperature of the heat treatment performed later is high, a substrate having a strain point of 730° C. or higher is preferably used. Note that by containing a large amount of barium oxide (BaO), a glass substrate which is heat-resistant and more practical can be obtained. Alternatively, crystallized glass or the like may be used.

In the case where a glass substrate is used as the formation substrate 601, an insulating film such as a silicon oxide film, a silicon oxynitride film, a silicon nitride film, or a silicon nitride oxide film is preferably formed between the formation substrate 601 and the separation layer 603, in which case contamination from the glass substrate can be prevented.

The separation layer 603 has a single-layer structure or a layered structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer 603 can be formed by a sputtering method, a plasma CVD method, a coating method, a printing method, or the like. Note that a coating method includes a spin coating method, a droplet discharge method, and a dispensing method.

In the case where the separation layer 603 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer 603 has a layered-structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, treatment with a highly oxidizing solution such as ozone water, or the like on the surface of the layer containing tungsten. Plasma treatment or heat treatment may be performed in an atmosphere of oxygen, nitrogen, nitrous oxide alone, or a mixed gas of any of these gasses and another gas. Surface condition of the separation layer 603 is changed by the plasma treatment or heat treatment, whereby adhesion between the separation layer 603 and the insulating film formed later can be controlled.

The insulating film included in the layer 605 preferably has a single-layer structure or a layered structure including any of a silicon nitride film, a silicon oxynitride film, a silicon nitride oxide film, and the like.

The insulating film can be formed by a sputtering method, a plasma CVD method, a coating method, a printing method, or the like. For example, the insulating film is formed at a temperature of higher than or equal to 250° C. and lower than or equal to 400° C. by a plasma CVD method, whereby a dense film having very low water permeability can be obtained. Note that the insulating film is preferably formed to have a thickness of greater than or equal to 10 nm and less than or equal to 3000 nm, further preferably greater than or equal to 200 nm and less than or equal to 1500 nm.

Figure 4B:
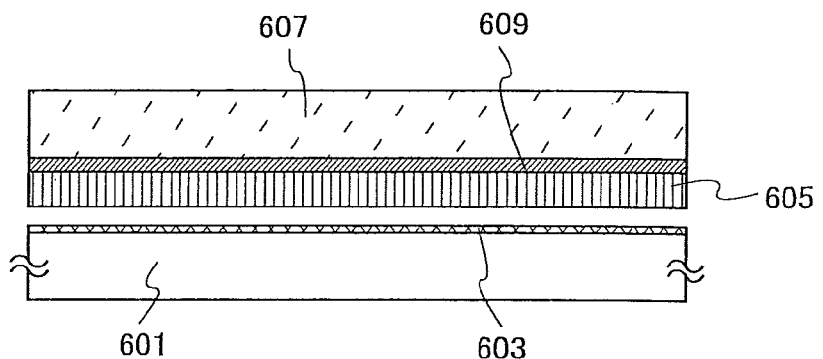

Next, the layer 605 and a temporary supporting substrate 607 are bonded with a separation adhesive 609, and the layer 605 is separated from the formation substrate 601 along the separation layer 603. By this process, the layer 605 to be separated is placed on the temporary supporting substrate 607 side (FIG. 4B).

As the temporary supporting substrate 607, a glass substrate, a quartz substrate, a sapphire substrate, a ceramic substrate, a metal substrate, or the like can be used. Alternatively, a plastic substrate that can withstand a processing temperature in this embodiment may be used, or a flexible film-like substrate may be used.

An adhesive with which the temporary supporting substrate 607 and the layer 605 can be chemically or physically separated when necessary, such as an adhesive that is soluble in water or a solvent or an adhesive which is capable of being plasticized upon irradiation of UV light or the like, is used as the separation adhesive 609.

Any of various methods can be used as appropriate as the process for transferring the layer to the temporary supporting substrate. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Further, the transfer process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Alternatively, the layer may be separated from the formation substrate after an interface between the separation layer and the layer is introduced to a liquid. The separation may be performed while pouring a liquid such as water.

As another separation method, the separation layer 603 formed using tungsten may be separated while etching the separation layer 603 using a mixed solution of ammonium water and a hydrogen peroxide solution.

Figure 4C:
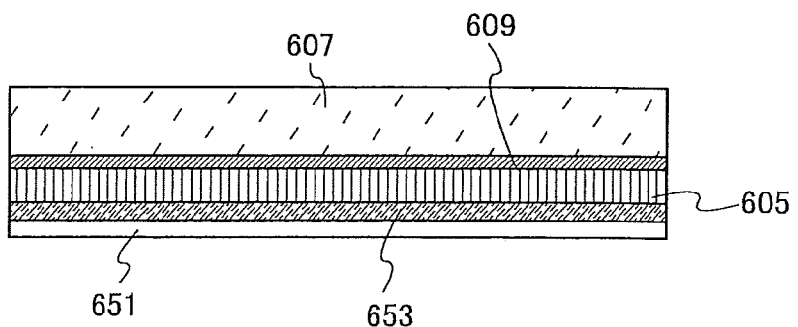

Next, with an adhesive layer 653 including an adhesive different from the separation adhesive 609, a first flexible substrate 651 is bonded to the separation layer 603 or the layer 605 which is exposed by the separation from the formation substrate 601 (FIG. 4C).

Figure 4D:
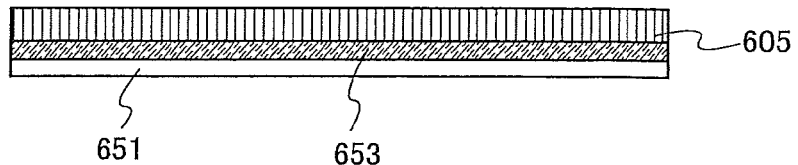

After that, the temporary supporting substrate 607 is removed by dissolving or plasticizing the separation adhesive 609. After the temporary supporting substrate 607 is removed, the separation adhesive 609 is removed using water, a solvent, or the like to expose the layer 605 (FIG. 4D).

Through the above steps, the layer 605 can be formed over the first flexible substrate 651.

Figure 4E:
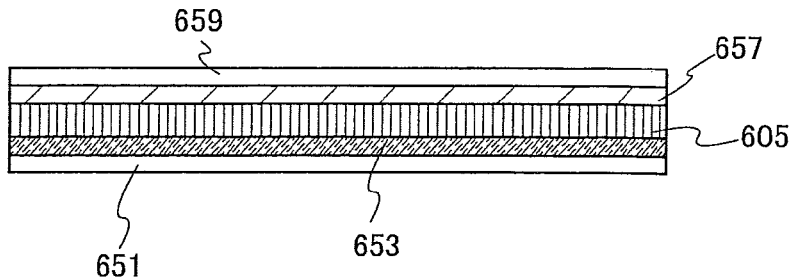

After that, other elements of the light-emitting device are formed, and then a second flexible substrate 659 is bonded thereto with an adhesive layer 657 (FIG. 4E).

In the above-described manner, the light-emitting device of one embodiment of the present invention can be manufactured.

Note that the separation layer is not necessary in the case where the formation substrate and the layer to be separated can be separated at their interface. For example, glass is used as the formation substrate 601, an organic resin such as polyimide is formed in contact with the glass, and the insulating film, the transistor, and the like are formed over the organic resin. In this case, heating the organic resin enables the separation at the interface between the formation substrate 601 and the organic resin. Then, the organic resin and the first flexible substrate 651 can be bonded with the adhesive layer 653. Alternatively, separation at the interface between a metal layer and the organic resin may be performed in the following manner: the metal layer is provided between the formation substrate and the organic resin and current is made to flow in the metal layer so that the metal layer is heated.

<Method B for Manufacturing Light-Emitting Device>

Figure 5A:
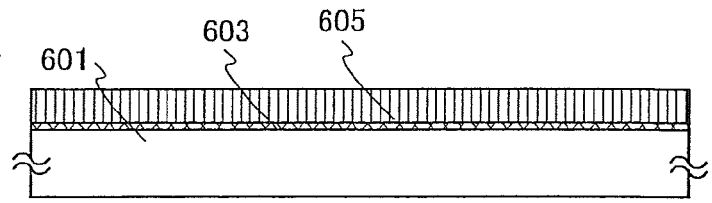
FIGS. 5A to 5E illustrate an example of a method for manufacturing a light-emitting device of one embodiment of the present invention.

First, a separation layer 603 is formed over a formation substrate 601, and a layer 605 to be separated (hereinafter referred to as layer 605) is formed over the separation layer 603 (FIG. 5A).

Figure 5B:
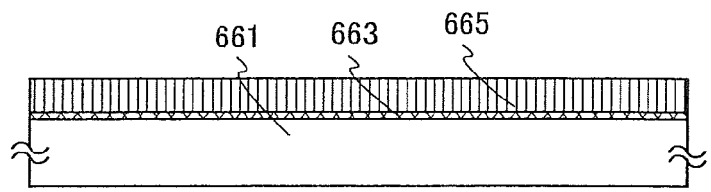

A separation layer 663 is formed over a formation substrate 661, and a layer 665 to be separated (hereinafter referred to as layer 665) is formed over the separation layer 663 (FIG. 5B).

Figure 5C:
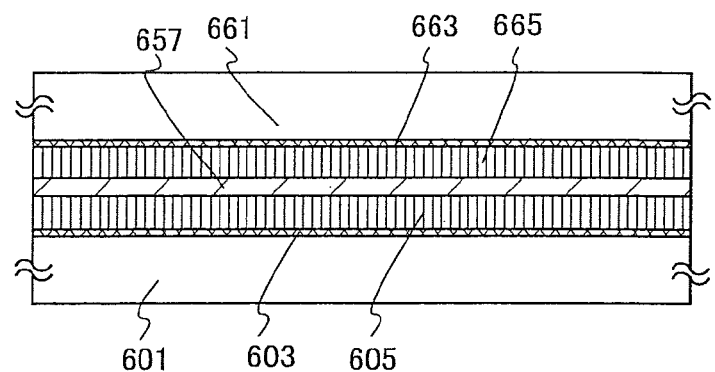

Next, the formation substrate 601 and the formation substrate 661 are bonded with the adhesive layer 657 (FIG. 5C).

Figure 5D:
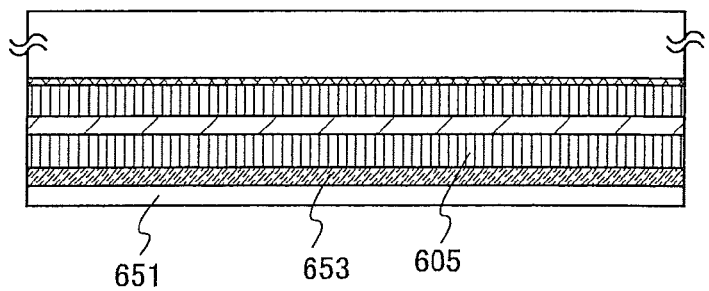

Then, the layer 605 is separated from the formation substrate 601 along the separation layer 603. Then, the first flexible substrate 651 is bonded to the separation layer 603 or the layer 605 which is exposed by separation from the formation substrate 601, with the adhesive layer 653 (FIG. 5D).

Figure 5E:
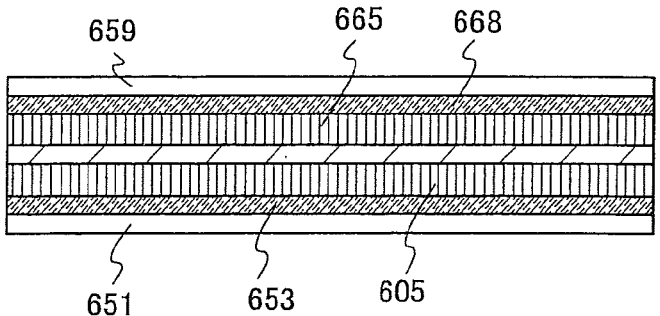

Similarly, the layer 665 is separated from the formation substrate 661 along the separation layer 663. Then, the second flexible substrate 659 is bonded to the separation layer 663 or the layer 665 which is exposed by separation from the formation substrate 651, with the adhesive layer 668 (FIG. 5E).

In the above-described manner, the light-emitting device of one embodiment of the present invention can be manufactured.

In the method for manufacturing a light-emitting device described in this embodiment, any of curable adhesives can be used as the adhesive layers 653, 657, and 668; for example, a light curable adhesive such as a UV curable adhesive, a reactive curable adhesive, a thermosetting adhesive, and an anaerobic adhesive can be used. The examples include an epoxy resin, an acrylic resin, a silicone resin, a phenol resin, and the like. In particular, a material with low moisture permeability, such as an epoxy resin, is preferred. Further, the above adhesives may include a drying agent (such as zeolite). Accordingly, deterioration of the light-emitting element can be suppressed. A curable adhesive provided on the side through which light emitted from the light-emitting element is extracted is a light-transmitting material, preferably with a high refractive index. For example, by mixing a filler with a high refractive index (e.g., titanium oxide or zirconium) into the adhesive layer, light from the light-emitting element can be extracted efficiently.

This embodiment can be freely combined with other embodiments.

Embodiment 4

In this embodiment, a light-emitting device which is one embodiment of the present invention is described with reference to FIGS. 6A and 6B and FIGS. 7A and 7B. The light-emitting device of this embodiment includes a light-emitting element of one embodiment of the present invention. The light-emitting element has high emission efficiency and thus a light-emitting device with low power consumption can be obtained.

Figure 6A:
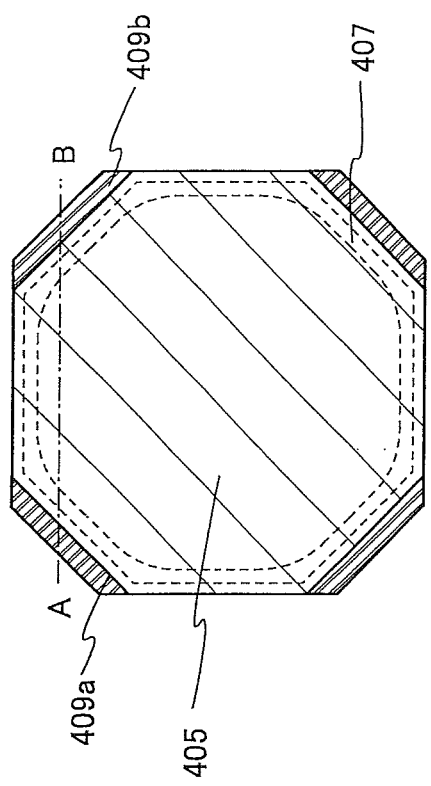
FIGS. 6A and 6B illustrate an example of a light-emitting device of one embodiment of the present invention.
Figure 6B:
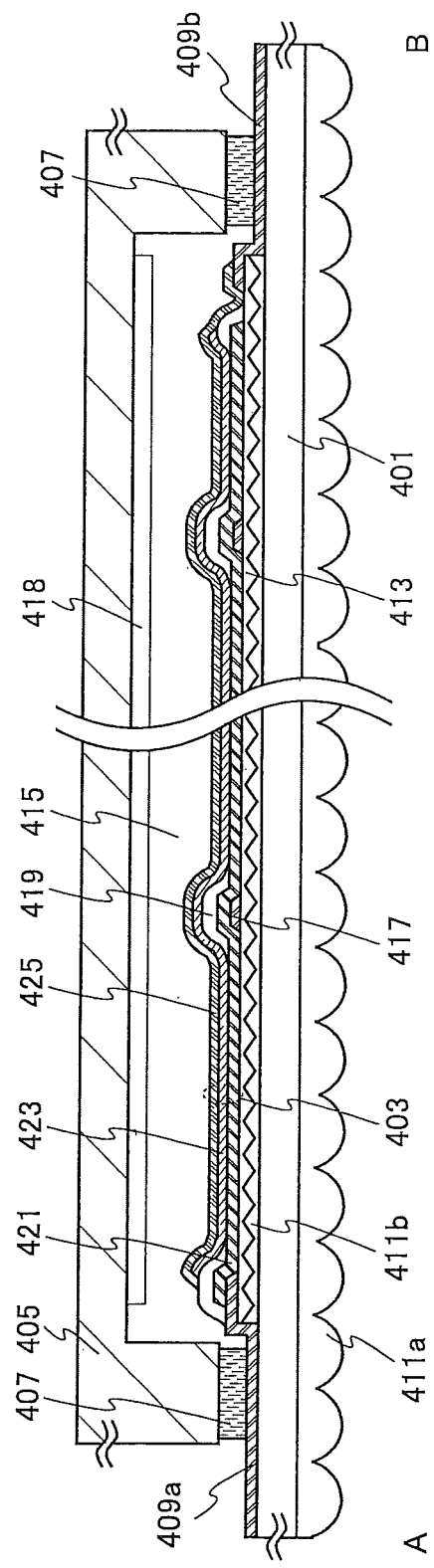

FIG. 6A is a plan view of a light-emitting device of one embodiment of the present invention, and FIG. 6B is a cross-sectional view taken along a dashed-dotted line A-B in FIG. 6A.

In the light-emitting device of this embodiment, a light-emitting element 403 is included in a space 415 surrounded by a supporting substrate 401, a sealing substrate 405, and a sealing material 407. The light-emitting element 403 is a light-emitting element having a bottom-emission structure; specifically, the first electrode 421 which transmits visible light is provided over the supporting substrate 401, the EL layer 423 is provided over the first electrode 421, and the second electrode 425 which reflects visible light is provided over the EL layer 423. The light-emitting element 403 is a light-emitting element of one embodiment of the present invention in Embodiment 1. The sealing substrate 405 includes a drying agent 418 on the light-emitting element 403 side.

A first terminal 409a is electrically connected to an auxiliary wiring 417 and the first electrode 421. An insulating layer 419 is provided in a region which overlaps with the auxiliary wiring 417 over the first electrode 421. The first terminal 409a and the second electrode 425 are electrically insulated by the insulating layer 419. The second terminal 409b is electrically connected to the second electrode 425. Note that although the first electrode 421 is formed over the auxiliary wiring 417 in this embodiment, the auxiliary wiring 417 may be formed over the first electrode 421.

Therefore, a light extraction structure 411a is preferably provided at the interface between the supporting substrate 401 and the atmosphere. Therefore when provided at the interface between the supporting substrate 401 and the atmosphere, the light extraction structure 411a can reduce light which cannot be extracted to the atmosphere due to total reflection, resulting in an increase in the light extraction efficiency of the light-emitting device.

A light extraction structure 411b is preferably provided at an interface between the light-emitting element 403 and the supporting substrate 401. In the case where the light extraction structure 411b has unevenness, a planarization layer 413 is preferably provided between the light extraction structure 411b and the first electrode 421. Thus, the first electrode 421 can be a flat film, and occurrence of leakage current in the EL layer 423 due to the unevenness of the first electrode 421 can be suppressed. Moreover, since the light extraction structure 411b is provided at an interface between the planarization layer 413 and the supporting substrate 401, light which cannot be extracted to the atmosphere due to total reflection can be reduced, so that the light extraction efficiency of the light-emitting device can be improved.

The planarization layer 413 is more flat in its one surface that is in contact with the first electrode 421 than in its other surface that is in contact with the light extraction structure 411b. As a material of the planarization layer 413, glass, liquid, a resin, or the like having a light-transmitting property and a high refractive index can be used.

Figure 7A:
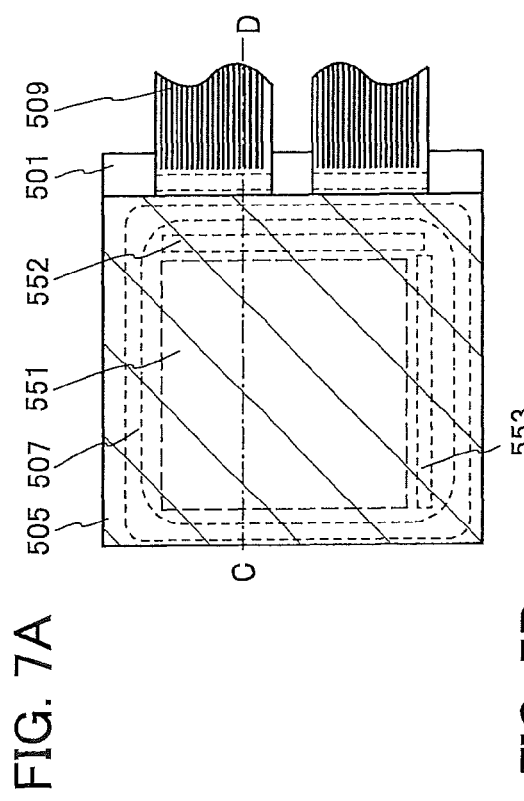
FIGS. 7A and 7B illustrate an example of a light-emitting device of one embodiment of the present invention.
Figure 7B:
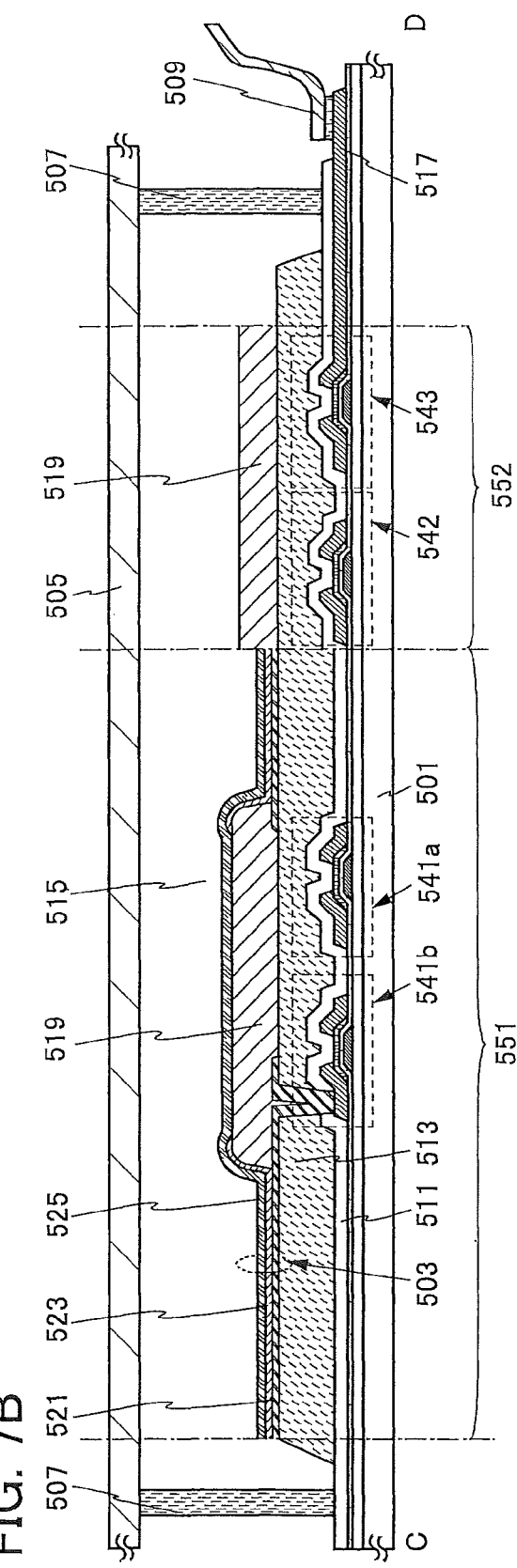

FIG. 7A is a plan view of a light-emitting device of one embodiment of the present invention. FIG. 7B is a cross-sectional view taken along dashed-dotted line C-D in FIG. 7A.

An active matrix light-emitting device according to this embodiment includes, over a supporting substrate 501, a light-emitting portion 551, a driver circuit portion 552 (gate side driver circuit portion), a driver circuit portion 553 (source side drive circuit portion), and the sealant 507. The light-emitting portion 551, the driver circuit portions 552 and 553 are formed in a space 515 formed by the supporting substrate 501, a sealing substrate 505, and the sealant 507.

Any of a separate coloring method, a color filter method, and a color conversion method can be applied to the light-emitting device of one embodiment of the present invention. The light-emitting portion 551 formed by a separate coloring method is illustrated in FIG. 7B.

The light-emitting portion 551 includes a plurality of light-emitting units each including a switching transistor 541a, a current control transistor 541b, and a second electrode 525 electrically connected to a wiring (a source electrode or a drain electrode) of the transistor 541b.

A light-emitting element 503 included in the light-emitting portion 551 has a bottom-emission structure and includes a first electrode 521 which transmits visible light, an EL layer 523, and the second electrode 525. Further, a partition wall 519 is formed so as to cover an end portion of the first electrode 521. In the EL layer 523, at least layers (e.g., light-emitting layers) which contain a variable material depending on the light-emitting element are colored separately.

Over the supporting substrate 501, a lead wiring 517 for connecting an external input terminal through which a signal (e.g., a video signal, a clock signal, a start signal, or a reset signal) or a potential from the outside is transmitted to the driver circuit portions 552 and 553 is provided. Here, an example in which a flexible printed circuit (FPC) 509 is provided as the external input terminal is described.

The driver circuit portions 552 and 553 have a plurality of transistors. FIG. 7B illustrates two of the transistors in the driver circuit portion 552 (transistors 542 and 543).

To prevent an increase in the number of manufacturing steps, the lead wiring 517 is preferably formed using the same material and the same step(s) as those of the electrode or the wiring in the light-emitting portion or the driver circuit portion. Described in this embodiment is an example in which the lead wiring 517 is formed using the same material and the same step(s) as those of the source electrode and the drain electrode of the transistor included in the light-emitting portion 551 and the driver circuit portion 552.

In FIG. 7B, the sealing, material 507 is in contact with a first insulating layer 511 over the lead wiring 517. The adhesion of the sealing material 507 to metal is low in some cases. Therefore, the sealing material 507 is preferably in contact with an inorganic insulating film over the lead wiring 517. Such a structure enables a light-emitting device to have high sealing capability, high adhesion, and high reliability. As examples of the inorganic insulating film, an oxide film of a metal or a semiconductor, a nitride film of a metal or a semiconductor, and a oxynitride film of a metal or a semiconductor are given; specifically, a silicon oxide film, a silicon nitride film, a silicon oxynitride film, a silicon nitride oxide film, an aluminum oxide film, a titanium oxide film, and the like can be given.

The first insulating layer 511 has an effect of preventing diffusion of impurities into a semiconductor included in the transistor. As the second insulating layer 513, an insulating film with a planarization function is preferably selected in order to reduce surface unevenness due to the transistor.

This embodiment can be combined with any of other embodiments, as appropriate.

Embodiment 5

In this embodiment, examples of electronic devices and lighting devices to which the light-emitting device of one embodiment of the present invention is applied will be described with reference to FIGS. 8A to 8E and FIGS. 9A and 9B.

Electronic devices of this embodiment each include the light-emitting device of one embodiment of the present invention in a display portion. Lighting devices of this embodiment each include the light-emitting device of one embodiment of the present invention in a light-emitting portion (lighting portion). An electronic device and a lighting device with low power consumption can be provided by adopting the light-emitting device of one embodiment of the present invention.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices and lighting devices are illustrated in FIGS. 8A to 8E and FIGS. 9A and 9B.

Figure 8A:
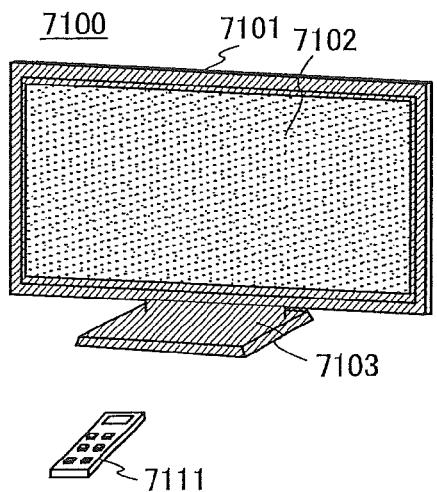
FIGS. 8A to 8E illustrate examples of an electronic device of one embodiment of the present invention.

FIG. 8A illustrates an example of a television set. In a television device 7100, a display portion 7102 is incorporated in a housing 7101. The display portion 7102 is capable of displaying images. The light-emitting device to which one embodiment of the present invention is applied can be used for the display portion 7102. In addition, here, the housing 7101 is supported by a stand 7103.

The television device 7100 can be operated with an operation switch provided in the housing 7101 or a separate remote controller 7111. With operation keys of the remote controller 7111, channels and volume can be controlled and images displayed on the display portion 7102 can be controlled. Further, the remote controller 7111 may be provided with a display portion for displaying data output from the remote controller 7111.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 8B:
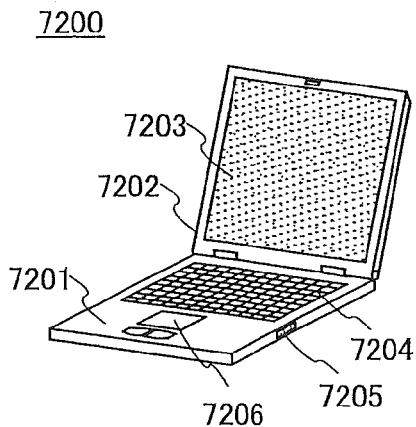

FIG. 8B illustrates an example of a computer. A computer 7200 includes a main body 7201, a housing 7202, a display portion 7203, a keyboard 7204, an external connecting port 7205, a pointing device 7206, and the like. Note that this computer is manufactured by using the light-emitting device of one embodiment of the present invention for the display portion 7203.

Figure 8C:
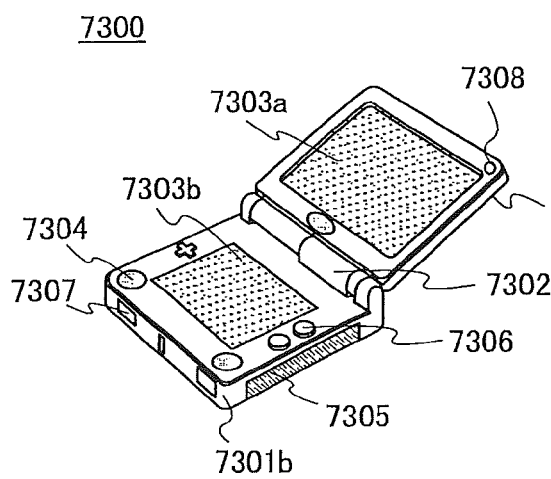

FIG. 8C illustrates an example of a portable game machine. A portable game machine 7300 has two housings, a housing 7301a and a housing 7301b, which are connected with a joint portion 7302 so that the portable game machine can be opened or closed. A display portion 7303a is incorporated in the housing 7301a and a display portion 7303b is incorporated in the housing 7301b. In addition, the portable game machine illustrated in FIG. 8C includes a speaker portion 7304, a recording medium insertion portion 7305, an operation key 7306, a connection terminal 7307, a sensor 7308 (a sensor having a function of measuring or sensing force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), an LED lamp, a microphone, and the like. The structure of the portable game machine is not limited to the above as long as the light-emitting device according to one embodiment of the present invention is used for at least either the display portion 7303a or the display portion 7303b, or both of them. The portable game machine may be provided with other accessories as appropriate. The portable game machine illustrated in FIG. 8C has a function of reading a program or data stored in a recording medium to display it on the display portion, and a function of sharing data with another portable game machine by wireless communication. Note that a function of the portable game machine illustrated in FIG. 8C is not limited to the above, and the portable game machine can have a variety of functions.

Figure 8D:
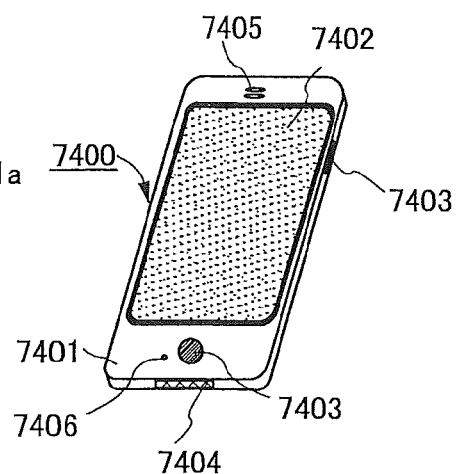

FIG. 8D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the mobile phone 7400 is manufactured by using the light-emitting device of one embodiment of the present invention for the display portion 7402.

When the display portion 7402 of the mobile phone 7400 illustrated in FIG. 8D is touched with a finger or the like, data can be input into the mobile phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted.

When a detection device including a sensor for detecting inclination, such as a gyroscope sensor or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 8E:
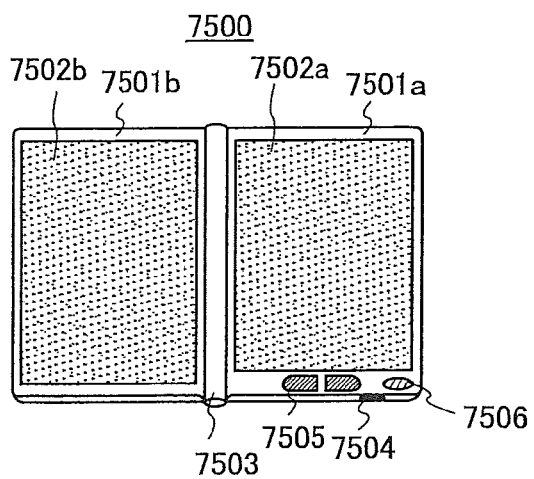

FIG. 8E illustrates an example of a foldable tablet terminal (in an open state). A tablet terminal 7500 includes a housing 7501a, a housing 7501b, a display portion 7502a, and a display portion 7502b. The housing 7501a and the housing 7501b are connected by a hinge 7503 and can be opened and closed along the hinge 7503. The housing 7501a includes a power switch 7504, operation keys 7505, a speaker 7506, and the like. Note that the tablet terminal 7500 is manufactured using the light-emitting device according to one embodiment of the present invention for either the display portion 7502a or the display portion 7502b, or both of them.

Part of the display portion 7502a or the display portion 7502b, in which data can be input by touching displayed operation keys can be used as a touch panel region. For example, the entire area of the display portion 7502a can display keyboard buttons and serve as a touch panel while the display portion 7502b can be used as a display screen.

Figure 9A:
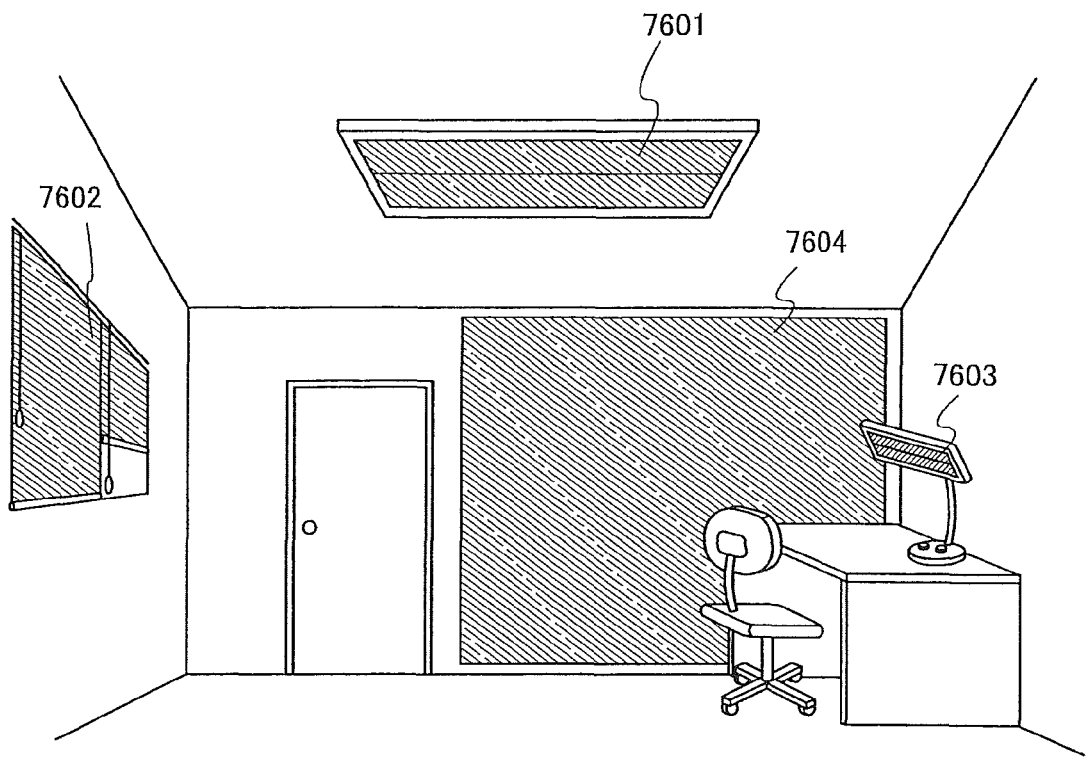
FIGS. 9A and 9B illustrate an example of a lighting device of one embodiment of the present invention.

An indoor lighting device 7601, a roll-type lighting device 7602, a desk lamp 7603, and a planar lighting device 7604 illustrated in FIG. 9A are each an example of a lighting device which includes the light-emitting device of one embodiment of the present invention. Since the light-emitting device of an embodiment of the present invention can also have a larger area, the light-emitting device of an embodiment of the present invention can be used as a lighting system having a large area. Further, since the light-emitting device is thin, the light-emitting device can be mounted on a wall.

Figure 9B:
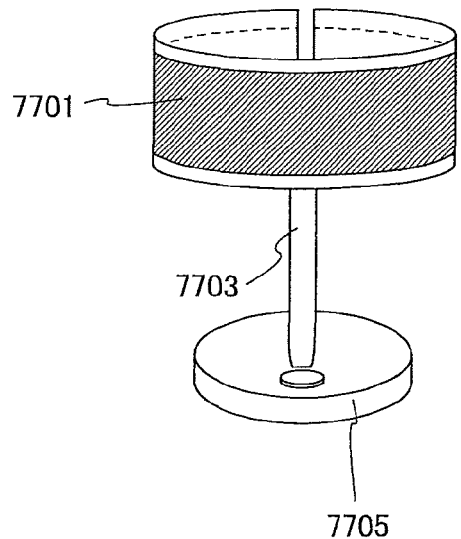

A desk lamp illustrated in FIG. 9B includes a lighting portion 7701, a support 7703, a support base 7705, and the like. The light-emitting device of one embodiment of the present invention is used for the lighting portion 7701. In one embodiment of the present invention, a lighting device whose light-emitting portion has a curved surface or a lighting device including a flexible lighting portion can be achieved. Such use of a flexible light-emitting device for a lighting device enables a place having a curved surface, such as the ceiling or dashboard of a motor vehicle, to be provided with the lighting device, as well as increases the degree of freedom in design of the lighting device.

Note that this embodiment can be combined with any of other embodiments, as appropriate.

Example 1

Figure 10A:
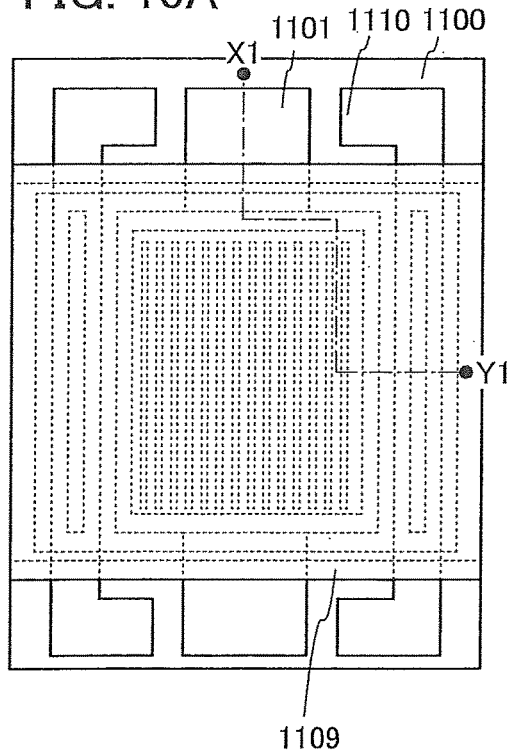
FIGS. 10A to 10D illustrate light-emitting devices in Example 1 and Example 2.
Figure 10B:
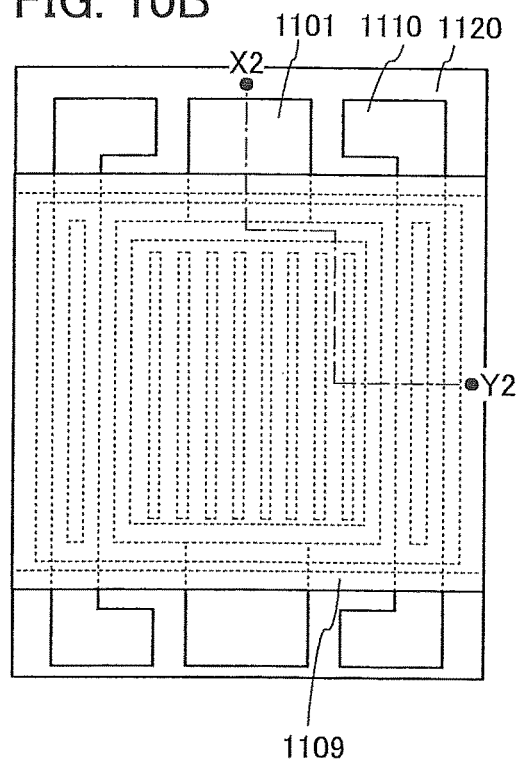

In Example 1, a light-emitting device which is one embodiment of the present invention is described with reference. In this example, a top-emission light-emitting device was manufactured. FIGS. 10A and 10B are plan views of the light-emitting device manufactured in this example. FIG. 11A is a cross-sectional view taken along dashed-dotted line X1-Y1 in FIG. 10A. FIG. 11B is a cross-sectional view taken along dashed-dotted line X2-Y2 in FIG. 10B. Note that some components of the light-emitting device are omitted in FIGS. 10A and 10B.

<Structure of Light-Emitting Device>

First, structures of light-emitting devices 1 to 4 manufactured in this example will be described. Table 1 shows the type of a supporting substrate of each light-emitting device, the area of a light-emitting region of each light-emitting device, and the presence or absence of a light extraction structure.

TABLE 1

| | Supporting substrate | Light-emitting region | Light extraction structure |
|---|---|---|---|
| Light-emitting device 1 | Glass | 56 mm × 42 mm | none |
| Light-emitting device 2 | | | provided |

TABLE 1-continued

| | Supporting substrate | Light-emitting region | Light extraction structure |
|---|---|---|---|
| Light-emitting device 3 | Stainless steel | | provided |
| Light-emitting device 4 | Glass | 2 mm × 2 mm | none |

The structure of the light-emitting device in FIG. 11A corresponds to the structure of the light-emitting device 2, and the structure except a light extraction structure 1109 corresponds to the structures of the light-emitting devices 1 and 4 (note that the area of a light-emitting region is different between the light-emitting devices 1 and 4). Specifically, in each of the light-emitting devices 1 and 4, a light-emitting element 1150 is provided over a supporting substrate 1100 with an insulating film 1104 interposed therebetween. The light-emitting element 1150 includes a first electrode 1101, an EL layer 1102, and a second electrode 1103. An end portion of the first electrode 1101 and an end portion of a terminal 1110 are covered with a partition wall 1105. The terminal 1110 is electrically connected to the second electrode 1103. In addition, an auxiliary wiring 1106 is provided over the first electrode 1101 with the partition wall 1105 provided therebetween, and is electrically connected to the second electrode 1103. The supporting substrate 1100 and a sealing substrate 1108 are bonded with a sealing material 1107. In the light-emitting device 2, the light extraction structure 1109 is bonded to the surface of the sealing substrate 1108.

The cross-sectional view of the light-emitting device in FIG. 11B corresponds to the cross-sectional view of the light-emitting device 3. Specifically, in the light-emitting device 3, the light-emitting element 1150 is provided over a supporting substrate 1120 with an insulating film 1124 interposed therebetween. The end portion of the first electrode 1101 and the end portion of the terminal 1110 are covered with a partition wall 1125. The terminal 1110 is electrically connected to the second electrode 1103. In addition, the auxiliary wiring 1106 is provided over the first electrode 1101 with the partition wall 1125 provided therebetween, and is electrically connected to the second electrode 1103. The supporting substrate 1120 and a sealing substrate 1128 are bonded with the sealing material 1107. Further, the light extraction structure 1109 is bonded to the surface of the sealing substrate 1128. In the light-emitting device 3 of this example, a thin stainless steel substrate was used as the supporting substrate 1120, and a substrate including a thin glass layer and a polyethylene terephthalate (PET) layer was used as the sealing substrate 1128. These substrates are flexible, and the light-emitting device 3 is a flexible light-emitting device.

Figure 18A:
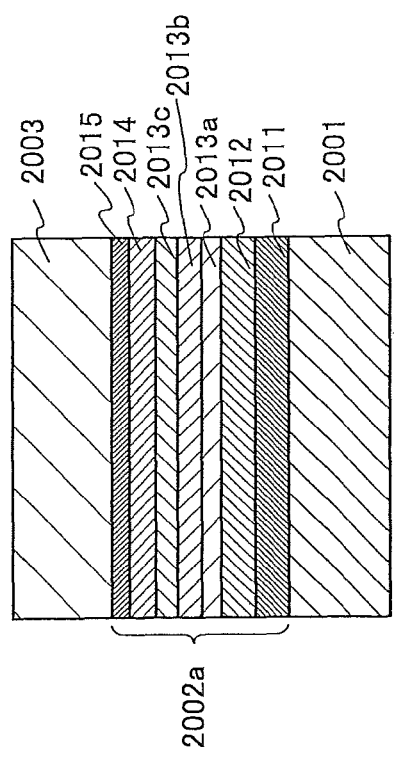
FIGS. 18A to 18D each illustrate a light emitting element in Examples 1 to 3.

A specific structure of the light-emitting element 1150 included in the light-emitting devices 1 to 4 is shown in FIG. 18A. The light-emitting element 1150 includes the first electrode 1101, the EL layer 1102 over the first electrode 1101, and the second electrode 1103 over the EL layer 1102. The EL layer 1102 includes a hole-injection layer 1111 over and in contact with the first electrode 1101, a hole-transport layer 1112 over and in contact with the hole-injection layer 1111, a first light-emitting layer 1113*a* over and in contact with the hole-transport layer 1112, a second light-emitting layer 1113*b* over and in contact with the first light-emitting layer 1113*a*, a third light-emitting layer 1113*c* over and in contact with the second light-emitting layer 1113*b*, an electron-transport layer 1114 over and in contact with the third light-emitting layer 1113*c*, and an interlayer 1116 over and in contact with the electron-transport layer 1114.

<Manufacturing Method of Light-Emitting Device>

Next, a method for manufacturing the light-emitting devices 1 to 4 is described.

<Light-Emitting Device 1>

First, a 100-nm-thick silicon oxynitride film was deposited by a CVD method to form the insulating film 1104 over a 0.7-mm-thick glass substrate which was the supporting substrate 1100.

Next, a 50-nm-thick titanium film was formed by a sputtering method. Then, a 200-nm-thick aluminum-nickel alloy film containing lanthanum (Al—Ni—La) was formed by a sputtering method. In addition, a 3-nm-thick titanium film was formed by a sputtering method. Then, heat treatment was performed in a nitrogen atmosphere at 250° C. for one hour. A 10-nm-thick indium tin oxide film containing silicon oxide (ITSO) was formed by a sputtering method. Thus, the first electrode 1101 serving as an anode was formed.

Next, in order to form a 1-μm-thick partition wall 1105, photosensitive polyimide was applied, exposed to light, and developed. After that, heat treatment was performed in a nitrogen atmosphere at 250° C. for one hour. Note that seven partition walls 1105 each having a width L1 of 330 μm were formed over the first electrode 1101.

Next, seven auxiliary wirings 1106 were formed using silver paste over the partition walls 1105 by a printing method. At this time, the pitch of the auxiliary wirings 1106 was 5.3 mm and the width L2 was 100 μm. Then, heat treatment was performed in an air atmosphere at 200° C. for 80 minutes.

Next, as pretreatment for forming the EL layer 1102, UV-ozone treatment was performed for 370 seconds after washing of a surface of the supporting substrate 1100 with water and baking that was performed at 200° C. for 1 hour.

After that, the supporting substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the supporting substrate 1100 was cooled down for about 30 minutes.

Next, an EL layer 1102 in which a plurality of layers were stacked was formed over the first electrode 1101. Chemical formulae of materials used for the EL layer 1102 are shown below.

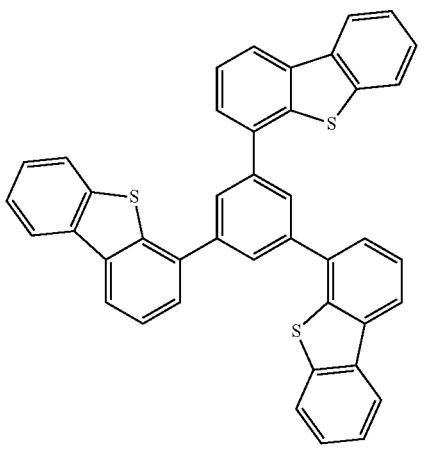

DBT3P-II

-continued
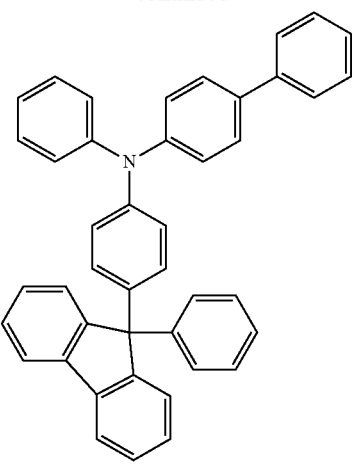
BPAFLP
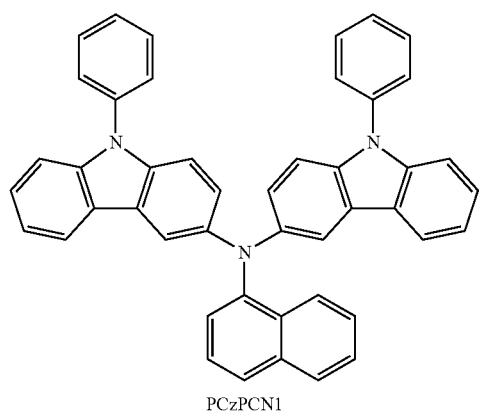
PCzPCN1
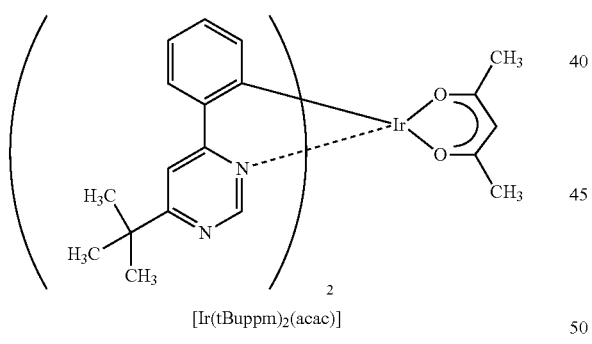
[Ir(tBuppm)₂(acac)]
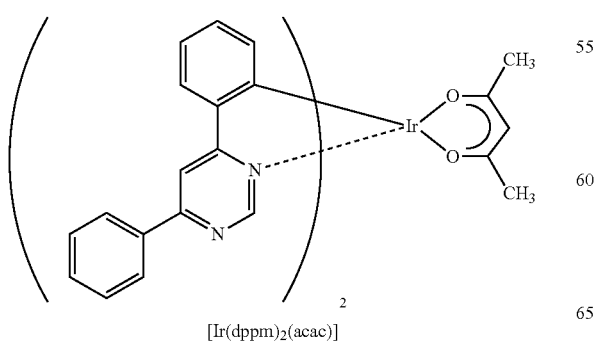
[Ir(dppm)₂(acac)]
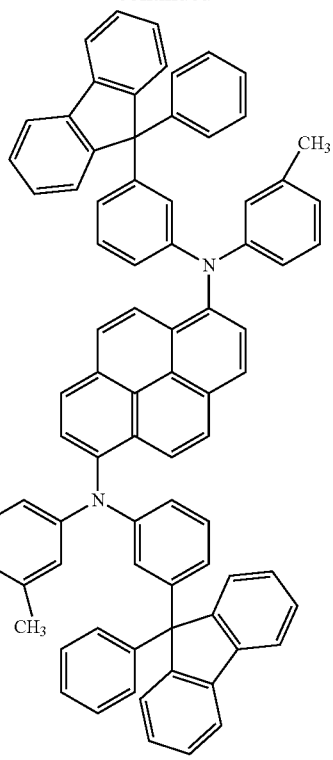
1,6mMemFLPAPrn
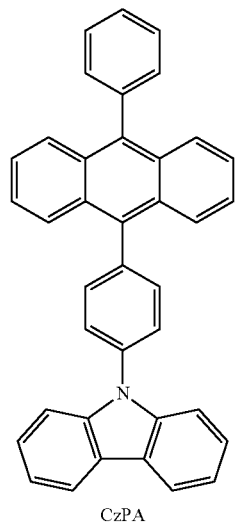
CzPA
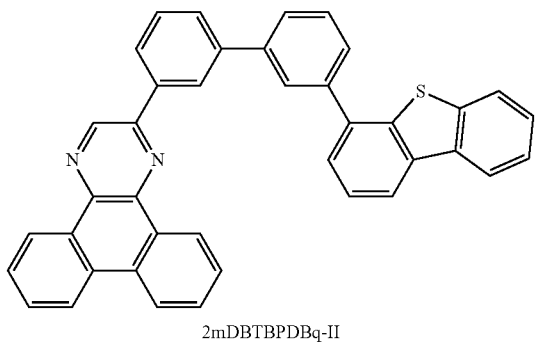
2mDBTBPDBq-II -continued

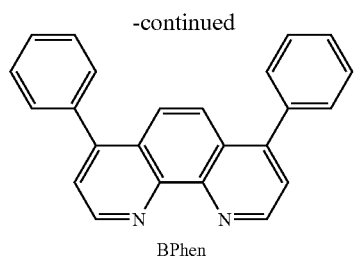
BPhen

First, the supporting substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, 4,4',4''-(1,3,5-benzenetriyl)tri(dibenzothiophene) (abbreviation: DBT3P-II) and molybdenum oxide were deposited by co-evaporation to form the hole-injection layer 1111 over the first electrode 1101. The thickness was 20 nm, and the weight ratio of DBT3P-II to molybdenum oxide was adjusted to 2:1 (=DBT3P-II:molybdenum oxide). Note that the co-evaporation refers to an evaporation method in which vapor deposition is carried out from a plurality of evaporation sources at the same time in one treatment chamber.

Next, 4-phenyl-4'-(9-phenylfluoren-9-yl)triphenylamine (abbreviation: BPAFLP) and 3-[N-(1-naphthyl)-N-(9-phenylcarbazol-3-yl)amino]-9-phenylcarbazole (abbreviation: PCzPCN1) were deposited by co-evaporation, whereby the hole-transport layer 1112 was formed on the hole-injection layer 1111. The thickness was 20 nm and the weight ratio of BPAFLP to PCzPCN1 was adjusted to 1:1 (=BPAFLP:PCzPCN1).

Further, 2-[3'-(dibenzothiophen-4-yl)biphenyl-3-yl] dibenzo[f,h]quinoxaline (abbreviation: 2mDBTBPDBq-II), PCzPCN1 and (acetylacetonato)bis(6-tert-butyl-4-phenylpyrimidinato)iridium(III) (abbreviation: [Ir(tBuppm)$_2$(acac)]) were deposited by co-evaporation to form the first light-emitting layer 1113a over the hole-transport layer 1112. Here, the weight ratio of 2mDBTBPDBq-II, PCzPCN1, and [Ir(tBuppm)$_2$(acac)] was adjusted to 0.7:0.3:0.06 (=2mDBTBPDBq-II:PCzPCN1:[Ir(tBuppm)$_2$(acac)]). The thickness of the first light-emitting layer 1113a was set to 12 nm.

Next, 2mDBTBPDBq-II, PCzPCN1, and (acetylacetonato)bis(4,6-diphenylpyrimidinato)iridium(III) (abbreviation: [Ir(dppm)$_2$(acac)]) were deposited on the hole-transport layer 1112 by co-evaporation, whereby the second light-emitting layer 1113b was formed over the first light-emitting layer 1113a. Here, the weight ratio of 2mDBTBP-DBq-II, PCzPCN1, and [Ir(dppm)$_2$(acac)] was adjusted to 0.8:0.2:0.06 (=2mDBTBPDBq-II:PCzPCN1: [Ir(dppm)$_2$(acac)]). In addition, the thickness of the second light-emitting layer 1113b was set to 18 nm.

Then, 9-[4-(N-carbazolyl)]phenyl-10-phenylanthracene (abbreviation: CzPA) and N,N'-bis(3-methylphenyl)-N,N'-bis[3-(9-phenyl-9H-fluoren-9-yl)phenyl]-pyrene-1,6-di amine (abbreviation: 1,6mMemFLPAPrn) were deposited by co-evaporation, whereby the third light-emitting layer 1113c was formed over the second light-emitting layer 1113b. The thickness was 10 nm. The weight ratio of CzPA to 1,6mMemFLPAPrn was adjusted to 1:0.05 (=CzPA:1, 6mMemFLPAPrn).

Next, CzPA was vapor-deposited to a thickness of 5 nm and then bathophenanthroline (abbreviation: BPhen) was vapor-deposited to a thickness of 10 nm, so that the electron-transport layer 1114 was formed over the third light-emitting layer 1113c.

Further, lithium oxide (Li$_2$O) was vapor-deposited to a thickness of 0.1 nm, copper phthalocyanine (abbreviation: CuPc) was vapor-deposited to a thickness of 1 nm, and DBT3P-II and molybdenum oxide were deposited to a thickness of 100 nm by co-evaporation, so that the interlayer 1116 was formed over the electron-transport layer 1114. Note that the thickness the weight ratio of DBT3P-II to molybdenum oxide was adjusted to 2:1 (=DBT3P-II:molybdenum oxide).

Finally, in order to form the second electrode 1103 serving as a cathode, indium tin oxide (ITO) was vapor-deposited to a thickness of 110 nm.

Note that, in the above evaporation process, evaporation was all performed by a resistance heating method.

Table 2 shows the element structure of the light-emitting element obtained as described above.

TABLE 2

| 1st electrode | | Hole-injection layer | Hole-transport layer | 1st light-emitting layer | 2nd light-emitting layer |
|---|---|---|---|---|---|
| Ti 50 nm | * ITSO 10 nm | DBT3P-II:MoOx (=2:1) 20 nm | BPAFLP:PCzPCN1 (=1:1) 20 nm | 2mDBTBPDBq-II:PCzPCN1:[Ir(tBuppm)$_2$(acac)] (=0.7:0.3:0.06) 12 nm | 2mDBTBPDBq-II:PCzPCN1:[Ir(dppm)$_2$(acac)] (=0.8:0.2:0.06) 18 nm |

| 3rd light-emitting layer | Electron-transport layer | | Interlayer | | | 2nd electrode |
|---|---|---|---|---|---|---|
| CzPA:1,6mMemFLPAPrn (=1:0.05) 10 nm | CzPA 5 nm | BPhen 10 nm | Li$_2$O 0.1 nm | CuPc 1 nm | DBT3P-II:MoOx (=2:1) 100 nm | ITO 110 nm |

* Light-emitting devices 1, 2, and 4: Al—Ni—La (200 nm)\Ti(3 nm), Light-emitting device 3: APC (200 nm)

Next, the supporting substrate 1100 and a glass substrate which is the sealing substrate 1108 were bonded using an ultraviolet curable epoxy resin which is the sealing material 1107. After that, heat treatment was performed in an air atmosphere at 80° C. for one hour.

<Light-Emitting Device 2>

A method for manufacturing the light-emitting device 2 includes steps similar to those in the manufacturing method of the light-emitting device 1 and also includes a lens diffusion plate (product name: LSD60PC10-F12, produced by Optical Solutions Corporation) which was the light extraction structure 1109 was bonded to the surface of the sealing substrate 1108 using an ultraviolet curable epoxy resin.

<Light-Emitting Device 3>

First, as pretreatment, UV ozone treatment was performed to a stainless steel substrate (thickness of 100 μm), which is the supporting substrate 1120, for 10 minutes. Next, the insulating film 1124 was formed over the supporting substrate 1120 using a heat-resistance polyamide-imide-based resin. Then, heat treatment was performed in an air atmosphere at 130° C. for 10 minutes and at 270° C. for 30 minutes.

Next, in order to form the first electrode 1101 serving as an anode, a 50-nm-thick titanium film was formed by a sputtering method, a 200-nm-thick copper-palladium-copper alloy (also referred to as APC) film was formed by a sputtering method, and further a 10-nm-thick ITSO film was formed by a sputtering method.

Then, fourteen partition walls 1125 each having a width L1 of 400 μm were formed over the first electrode 1101 using a thermal curable epoxy resin by a printing method. After the first printing, heat treatment was performed under an air atmosphere at 150° C. for 10 minutes, and then second printing was performed. Then, heat treatment was performed in an air atmosphere at 200° C. for 80 minutes. Further, at the same time, a partition wall 1125 covering an end portion of the first electrode 1101 and an end portion of the terminal 1110 was formed over the insulating film 1124.

Next, fourteen auxiliary wiring 1106 each having a width L2 of 200 μm were formed over the partition walls 1125 using silver paste by a printing method. The pitch of the auxiliary wiring 1106 was 3 mm. Then, heat treatment was performed in an air atmosphere at 200° C. for 80 minutes.

Next, the EL layer 1102 and the second electrode 1103 were formed over the first electrode 1101 in the conditions similar to those of the light-emitting device 1.

Next, the supporting substrate 1120 and the substrate including a thin glass layer and a polyethylene terephthalate (PET) layer which was the sealing substrate 1128 were bonded using a UV curable epoxy resin which was the sealing material 1107. Then, in order to cure the sealing material 1107, UV light irradiation was performed for 120 seconds. Next, heat treatment was performed in an air atmosphere at 80° C. for one hour. Then, the lens diffusion plate (product name: LSD60PC10-F12, produced by Optical Solutions Corporation) which was the light extraction structure 1109 was bonded to the surface of the sealing substrate 1128 using an ultraviolet curable epoxy resin.

<Light-Emitting Device 4>

A manufacturing method of the light-emitting device 4 is similar to that of the light-emitting device 1.

<Characteristics of Light-Emitting Device>

Table 3 shows initial values of main characteristics of the light-emitting devices 1 to 3 at a current density of 0.45 mA/cm² and the light-emitting device 4 at a current density of 2.5 mA/cm².

In the light-emitting element of this example, the green-light-emitting phosphorescent compound, the orange-light-emitting phosphorescent compound, and the blue-light-emitting fluorescent compound were used as light-emitting substances. Adjustment of emission balance among the phosphorescent and fluorescent light-emitting layers could increase emission efficiency of the light-emitting element.

In the light-emitting element of this example, the electron-transport organic compound is used as a host material of the blue-light-emitting fluorescent compound and is positioned to be the closest to the cathode among the three light-emitting layers;

with this structure, light emission from the phosphorescent compounds is easily obtained. Accordingly, the light-emitting element with high emission efficiency was achieved.

Although light emitted from a fluorescent compound is weaker than that from a phosphorescent compound, the light-emitting element of this example is preferable particularly in the case where a strong blue emission is unnecessary and high emission efficiency is required, for example, for a warm-white light-emitting device used as lighting.

The power efficiency of the light-emitting device 2 was 100 lm/W, which was about 1.4 times as high as that of the light-emitting device 1. This is because the light extraction efficiency was increased owing to the light extraction structure 1109 included in the light-emitting device 2. Further, the light-emitting device 3, which is flexible, shows favorable performance equivalent to that of the light-emitting device 2 manufactured over the glass substrate.

Figure 12:
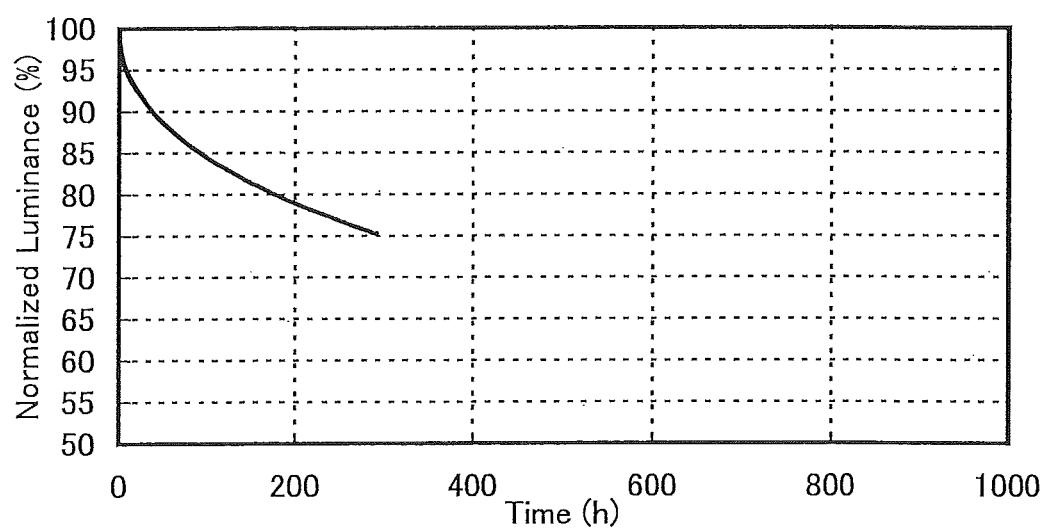
FIG. 12 shows results of a reliability test.

Results of the reliability test of the light-emitting device 4 are shown in FIG. 12. In FIG. 12, the vertical axis represents normalized luminance (%) on the assumption that the initial luminance is 100%, and the horizontal axis represents driving time (h) of the elements. In the reliability test, the light-emitting element 4 was driven at room temperature under the conditions where the initial luminance was set to 5000 cd/m² and the current density was constant. This corresponds to an initial luminance of 7000 cd/m² when the light extraction structure 1109 is provided. The half decay time of luminance at an initial luminance of 1,000 cd/m² is 100,000 hours by the estimation based on the results of FIG. 12, which is a favorable driving lifetime.

[Reflective Electrode]

In a top-emission light-emitting device, an aluminum alloy or the like can be used as a reflective electrode (the lower electrode and the first electrode 1101) of the light-emitting element. An aluminum alloy is preferably used for the following reasons: it is inexpensive, it has a high reflectance, it is easily processed, and the like. On the other hand, in terms of carrier injection into a light-emitting element (EL layer), a transparent oxide conductive material such as ITO and ITSO is superior to an aluminum alloy. However, it is not preferable that aluminum and a transparent conductive material have direct contact because they might corrode. Thus, a thin titanium film was provided

TABLE 3

Figure 13:
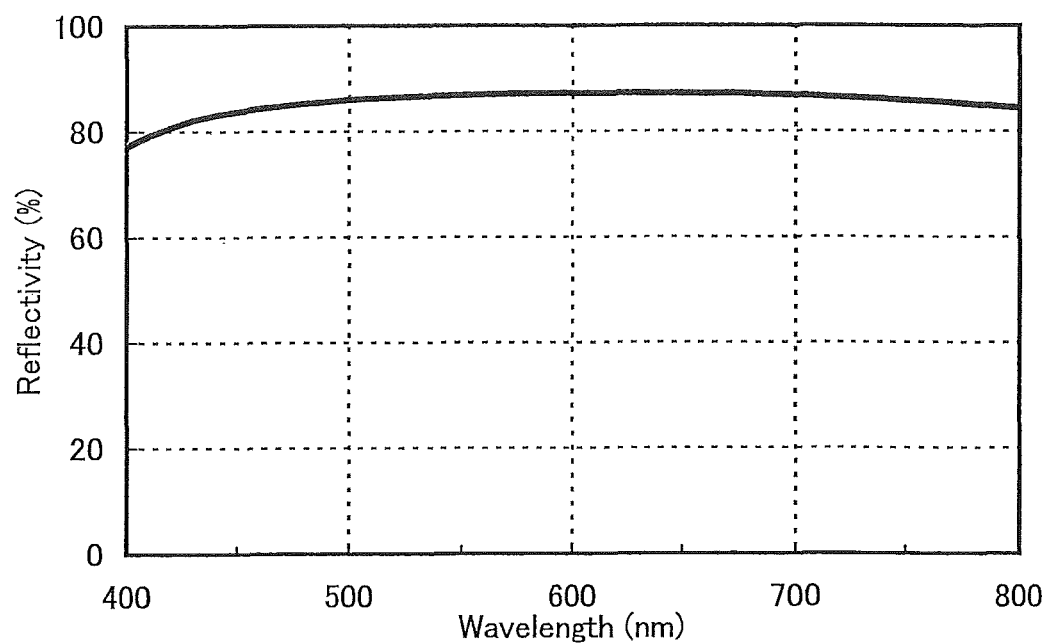
FIG. 13 shows measurement results of reflectivity of an electrode.

|  | Voltage (V) | Chromaticity (x, y) | Correlated color temperature (K) | Power efficiency (lm/W) | External quantum efficiency (%) |
| --- | --- | --- | --- | --- | --- |
| Light-emitting device 1 | 2.57 | (0.48, 0.51) | 3100 | 74 | 19 |
| Light-emitting device 2 | 2.57 | (0.50, 0.50) | 2800 | 100 | 27 |
| Light-emitting device 3 | 2.54 | (0.50, 0.49) | 2800 | 92 | 25 |
| Light-emitting device 4 | 2.80 | (0.50, 0.50) | 2800 | 87 | 26 | between an Al—Ni—La film and an ITSO film in this example. A titanium film is easily oxidized and thus becomes a titanium oxide film by oxygen in the air, heat treatment after the titanium film is deposited, or the like. Since a titanium oxide is stable in the air and has conductivity, it does not prevent hole injection into the light-emitting element (EL layer). Further, a problem such as corrosion does not occur if a transparent oxide conductive film is formed over a titanium film. Further, a titanium oxide film has a transmitting property with respect to visible light. As shown in FIG. 13, since the reflectance of the first electrode 1101 used in this example is 80% or more in a visible light region, the electrode can be preferably used as a reflective electrode of a light-emitting element.

[Interlayer]

In a top-emission light-emitting device, an upper electrode of a light-emitting element needs to have a transmitting property with respect to visible light. Therefore, ITO was used for the second electrode 1103 in this example. Further, when the interlayer 1116 which is in contact with the second electrode 1103 is provided as in the light-emitting device of this example, an excellent carrier injection property from ITO can be obtained. Further, sputtering damage to the EL layer 1102 at the time of ITO deposition can be reduced.

[Substrate]

A metal substrate such as an aluminum substrate or a stainless steel substrate has higher heat dissipation property than a glass substrate and thus easily dissipates heat generated from a light-emitting element. The reliability of a light-emitting element is easily lowered due to decrease in lifetime and increase in percentage of defects caused by high temperature.

Figure 14:
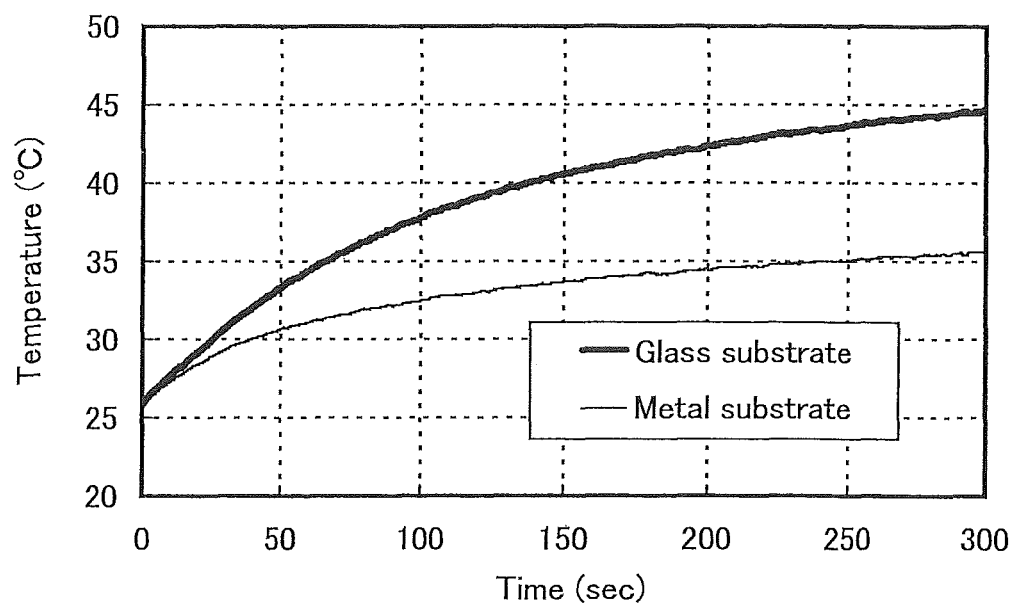
FIG. 14 shows measurement results of temperature characteristics.
Figure 15A:
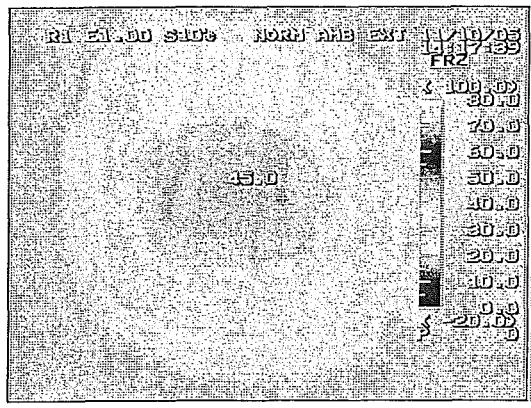
FIGS. 15A and 15B show measurement results of temperature distribution on a surface of a light-emitting element.
Figure 15B:
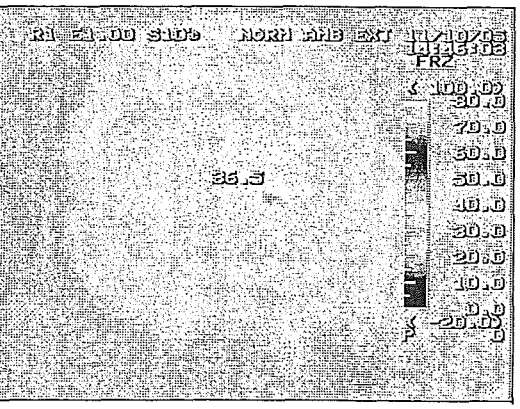

Here, light-emitting elements were manufactured over a glass substrate and an aluminum substrate under the same conditions. FIG. 14 shows results of measuring surface temperatures in the center of the elements using a thermocouple when a constant current was kept being flown under room temperature. FIG. 15A shows results of temperature distributions on the surface of the element over the glass substrate at 300 seconds after the start of the driving. FIG. 15B shows results of temperature distributions on the surface of the element over the aluminum substrate after 300 seconds of start of the driving. These temperatures were measured under room temperature.

From the results, the surface temperature of the light-emitting element manufactured over the aluminum substrate is, in the entire region, lower than that of the light-emitting element manufactured over the glass substrate; in the center of the element where the temperature tends to increase particularly, the surface temperature was lower by about 10° C. The results show that a highly reliable light-emitting device can be manufactured using a metal substrate. The results also show that a highly reliable flexible light-emitting device can be manufactured using a thin and flexible metal substrate as in the light-emitting device 3 of this example. Note that it has been confirmed that, the light-emitting device in which the metal substrate has a thickness of 200 μm is not broken and stable light emission can be obtained if the light-emitting device is bent to a radius curvature of 21 mm.

Example 2

Figure 10C:
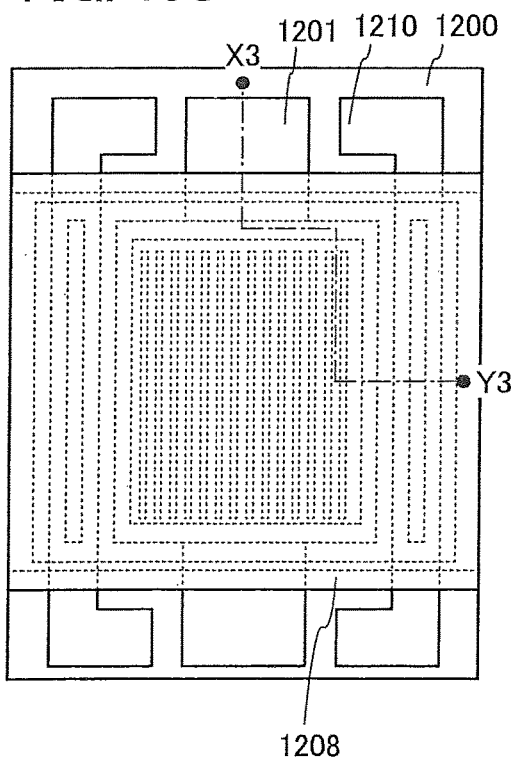
Figure 10D:
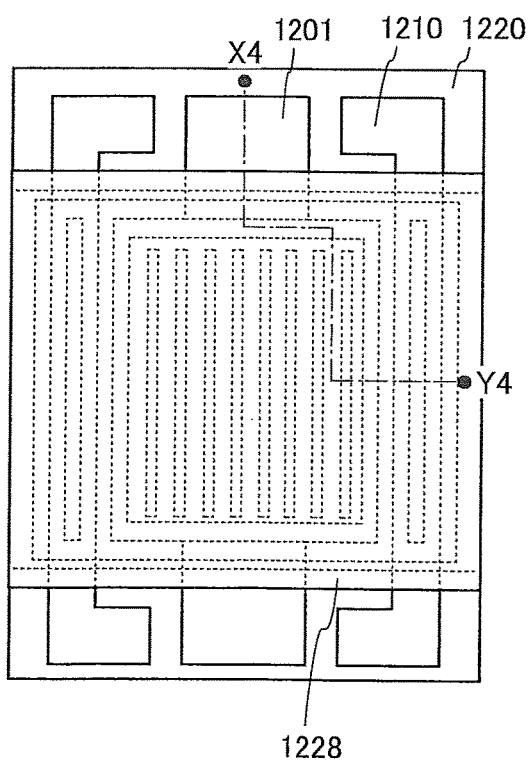

In Example 2, a light-emitting device which is one embodiment of the present invention is described. In this example, a bottom-emission light-emitting device was manufactured. FIGS. 10C and 10D are plan views of the light-emitting device manufactured in this example. FIG. 16A is a cross-sectional view taken along dashed-dotted line X3-Y3 in FIG. 10C. FIG. 11B is a cross-sectional view taken along dashed-dotted line X4-Y4 in FIG. 10D. Note that some components of the light-emitting device are omitted in FIGS. 10C and 10D.

<Structure of Light-Emitting Device>

First, structures of light-emitting devices 5 to 9 manufactured in this example will be described. Table 4 shows the type of a supporting substrate of each light-emitting device, the area of a light-emitting region of each light-emitting device, and the presence or absence of a light extraction structure.

TABLE 4

|  | Substrate | Light-emitting region | Light extraction structure |
| --- | --- | --- | --- |
| Light-emitting device 5 | Glass | 56 mm × 42 mm | none |
| Light-emitting device 6 |  |  | provided |
| Light-emitting device 7 | PEN film |  | provided |
| Light-emitting device 8 | Glass | 2 mm × 2 mm | none |
| Light-emitting device 9 | PEN film |  | none |

The structure of the light-emitting device in FIG. 16A corresponds to the structure of the light-emitting device 6, and the structure except a light extraction structure 1209 corresponds to the structures of the light-emitting devices 5 and 8 (note that the area of a light-emitting region is different between the light-emitting devices 5 and 8). Specifically, in each of the light-emitting devices 5 and 8, a light-emitting element 1250 is provided over a supporting substrate 1200 with an insulating film 1204 interposed therebetween. The light-emitting element 1250 includes a first electrode 1201, an EL layer 1202, and a second electrode 1203. The auxiliary wiring 1206 is provided over the insulating film 1204 and is electrically connected to the first electrode 1201. An end portion of the first electrode 1201 and an end portion of a terminal 1210 are covered with a partition wall 1205. Further, the partition wall 1205 is provided to cover the auxiliary wiring 1206 with the first electrode 1201 provided therebetween. The supporting substrate 1200 and a sealing substrate 1208 are bonded with a sealing material 1207. In the light-emitting device 6, the light extraction structure 1209 is bonded to the surface of the supporting substrate 1200.

The cross-sectional view of the light-emitting device in FIG. 16B corresponds to that of the light-emitting device 7, and the structure except the light extraction structure 1209 corresponds to the structures of the light-emitting device 9 (note that the area of a light-emitting region is different between the light-emitting devices 7 and 9). Specifically, in the light-emitting device 9, the light-emitting element 1250 is provided over a supporting substrate 1220 with an insulating film 1224 interposed therebetween. The auxiliary wiring 1206 is provided over the insulating film 1224 and is electrically connected to the first electrode 1201. The end portion of the first electrode 1201 and the end portion of the terminal 1210 are covered with the partition wall 1205. Further, the partition wall 1205 is provided to cover the auxiliary wiring 1206 with the first electrode 1201 provided therebetween. The supporting substrate 1220 and a sealing substrate 1228 are bonded with a sealing material 1227. In the light-emitting device 7, the light extraction structure 1209 is bonded to the surface of the supporting substrate 1220. In the light-emitting devices 7 and 9 of this example, a polyethylene naphthalate (PEN) film substrate and a thin stainless steel substrate were used as the supporting substrate 1220 and the sealing substrate 1228, respectively. These substrates are flexible, and the light-emitting devices 7 and 9 are flexible light-emitting devices.

Figure 18B:
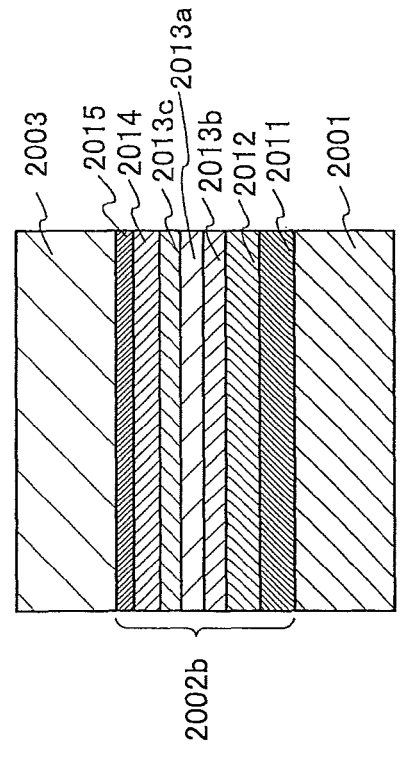

A specific structure of the light-emitting element 1250 included in the light-emitting devices 5 to 9 is shown in FIG. 18B. The light-emitting element 1250 includes the first electrode 1201, the EL layer 1202 over the first electrode 1201, and the second electrode 1203 over the EL layer 1202. The EL layer 1202 includes a hole-injection layer 1211 over and in contact with the first electrode 1201, a hole-transport layer 1212 over and in contact with the hole-injection layer 1211, a first light-emitting layer 1213a over and in contact with the hole-transport layer 1212, a second light-emitting layer 1213b over and in contact with the first light-emitting layer 1213a, a third light-emitting layer 1213c over and in contact with the second light-emitting layer 1213b, an electron-transport layer 1214 over and in contact with the third light-emitting layer 1213c, and an electron-injection layer 1215 over and in contact with the electron-transport layer 1214.

<Manufacturing Method of Light-Emitting Device>

Next, a manufacturing method of the light-emitting devices 5 to 9 is described.

<Light-Emitting Device 5>

First, a 100-nm-thick silicon oxynitride film was deposited by a CVD method to form the insulating film 1204 over a 0.7-mm-thick glass substrate which was the supporting substrate 1200.

Next, a 100-nm-thick titanium film was formed by a sputtering method, a 1000-nm-thick aluminum film was formed by a sputtering method, and then a 100-nm-thick titanium film was formed by a sputtering method, whereby seven auxiliary wirings 1206 were formed. At this time, the pitch of the auxiliary wirings 1206 was 5.3 mm and the width L4 was 322 μm.

Next, an ITSO film was formed over the supporting substrate 1200 and the auxiliary wirings 1206 by a sputtering method, so that the first electrode 1201 serving as an anode was formed. Note that the thickness was 110 nm.

Next, in order to form the partition wall 1205 with a thickness of 1.5 μm, photosensitive polyimide was applied, exposed to light, and developed. After that, heat treatment was performed in a nitrogen atmosphere at 250° C. for one hour. Note that seven partition walls 1205 covering the auxiliary wirings 1206 were formed to have a width L3 of 330 μm.

Next, as pretreatment for forming the EL layer 1202, UV-ozone treatment was performed for 370 seconds after washing of a surface of the supporting substrate 1200 with water and baking that was performed at 200° C. for 1 hour.

After that, the supporting substrate 1200 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the supporting substrate 1200 was cooled down naturally for about 30 minutes.

Next, an EL layer 1202 was foinied over the first electrode 1201. Chemical formulae of materials used for the EL layer 1202 are shown below. Note that the materials the chemical formulae of which are described above will be omitted.

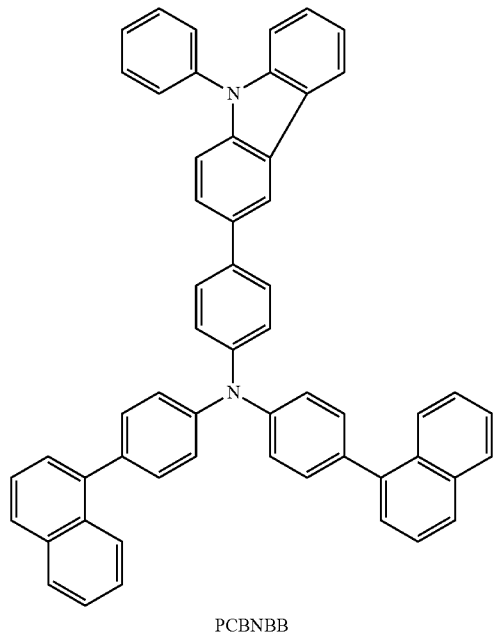

PCBNBB

Then, the supporting substrate 1200 over which the first electrode 1201 was formed was fixed to a substrate holder provided in the vacuum evaporation apparatus so that the surface on which the first electrode 1201 was formed faced downward. The pressure in the vacuum evaporation apparatus was reduced to about $10^{-4}$ Pa. After that, over the first electrode 1201, DBT3P-II and molybdenum oxide were deposited by co-evaporation by an evaporation method using resistance heating, so that the hole-injection layer 1211 was formed over the first electrode 1201. The thickness was 30 nm, and the weight ratio of DBT3P-II to molybdenum oxide was adjusted to 2:1 DBT3P-II:molybdenum oxide).

Next, in order to form the hole-transport layer 1212 over the hole-injection layer 1211, BPAFLP was vapor-deposited to a thickness of 20 nm.

Further, the first light-emitting layer 1213a was formed over the hole-tranport layer 1212 by co-evaporation of 2mDBTBPDBq-II, 4,4'-di(1-naphthyl)-4"-(9-phenyl-9H-carbazol-3-yl)triphenylamine (abbreviation: PCBNBB), and [Ir(tBuppm)$_2$(acac)]. Here, the weight ratio of 2mDBTBP-DBq-II to PCBNBB to [Ir(tBuppm)$_2$(acac)] was adjusted to 0.7:0.3:0.06 (=2mDBTBPDBq-II: PCBNBB:[Ir(tBuppm)$_2$(acac)]). The thickness of the first light-emitting layer 1213a was set to 8 nm.

Next, 2mDBTBPDBq-II, PCBNBB, and [Ir(dppm)$_2$(acac)]) were deposited by co-evaporation, whereby the second light-emitting layer 1213b was formed over the first light-emitting layer 1213a. Here, the weight ratio of 2mDBTBPDBq-II, PCBNBB, and [Ir(dppm)$_2$(acac)] was adjusted to 0.8:0.2:0.06 (=2mDBTBPDBq-II:PCBNBB:[Ir(dppm)$_2$(acac)]). In addition, the thickness of the second light-emitting layer 1213b was set to 22 nm.

Then, in order to form the third light-emitting layer 1213c over the second light-emitting layer 1213b, CzPA and 1,6mMemFLAPAPrn were deposited to a thickness of 10 nm by co-evaporation. The weight ratio of CzPA to 1,6mMemFLPAPrn was adjusted to 1:0.05 CzPA:1,6mMemFLPAPrn).

Next, CzPA was vapor-deposited to a thickness of 5 nm and then BPhen was vapor-deposited to a thickness of 15 nm, so that the electron-transport layer 1214 was formed over the third light-emitting layer 1213c.

Further, in order to form the electron-injection layer 1215 over the electron-transport layer 1214, lithium fluoride (LiF) was vapor-deposited to a thickness of 1 nm.

Finally, in order to form the second electrode 1203 serving as a cathode, silver (Ag) and magnesium (Mg) were deposited to a thickness of 1 nm by co-evaporation and further silver (Ag) was vapor-deposited to a thickness of 200 nm. Here, the volume ratio of Ag to Mg was adjusted to 2:1 (=Ag:Mg).

Note that, in the above evaporation process, evaporation was all performed by a resistance heating method.

The element structure of the light-emitting element obtained as described above is shown in Table 5.

As the layer 605, first, the insulating film 1224 was formed over the separation layer 603. For the insulating film 1224, a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film were stacked in this order. After that, heat treatment was performed at 480° C. in a nitrogen atmosphere for one hour.

Next, the auxiliary wiring 1206, the first electrode 1201, and the partition wall 1205 were formed in conditions similar to those in the light-emitting device 5.

Then, a UV curable adhesive film (also referred to as UV film) serving as the temporary supporting substrate 607 and the first electrode 1201 were bonded using a water-soluble resin serving as the separation adhesive 609. Then, the layer 605 is separated from the formation substrate 601 along the

TABLE 5

| 1st electrode | Hole-injection layer | Hole-transport layer | 1st light-emitting layer | 2nd light-emitting layer | |
|---|---|---|---|---|---|
| ITSO 110 nm | DBT3P-II:MoOx (=2:1) 30 nm | BPAFLP 20 nm | 2mDBTBPDBq-II:PCBNBB:[Ir(tBuppm)$_2$(acac)] (=0.7:0.3:0.06) 8 nm | 2mDBTBPDBq-II:PCBNBB:[Ir(dppm)$_2$(acac)] (=0.8:0.2:0.06) 22 nm | |

| | | | 3rd light-emitting layer | Electron-transport layer | Electron-injection layer | 2nd electrode | |
|---|---|---|---|---|---|---|---|
| | | | CzPA:1,6mMemFLPAPrn (=1:0.05) 10 nm | CzPA 5 nm | BPhen 15 nm | LiF 1 nm | Ag:Mg (=2:1) 1 nm | Ag 200 nm |

Next, the supporting substrate 1200 and a glass substrate which is the sealing substrate 1208 were bonded using an ultraviolet curable epoxy resin which is the sealing material 1207. After that, heat treatment was performed in an air atmosphere at 80° C. for one hour.

In addition, in order to cure the sealing material 1207, UV light irradiation was performed for 60 seconds.

<Light-Emitting Device 6>

A method for manufacturing the light-emitting device 6 includes steps similar to those in the manufacturing method of the light-emitting device 5 and also includes a lens diffusion plate (product name: LSD60PC10-F12, produced by Optical Solutions Corporation) which was the light extraction structure 1209 was bonded to the surface of the supporting substrate 1200 using an ultraviolet curable epoxy resin.

<Light-Emitting Device 7>

The light-emitting device 7 was manufactured by employing the manufacturing method A (FIGS. 4A to 4E) of a light-emitting device, which was described in Embodiment 3. First, a 100-nm-thick silicon oxynitride film was formed as a base film over a glass substrate serving as the formation substrate 601. Then, washing was performed using a hydrogen fluoride aqueous solution of 0.5%. This step leads to improvement in adhesion between the base film and the separation layer 603 to be formed later.

Next, a 30-nm-thick tungsten film was formed over the base film as the separation layer 603, and the layer 605 was formed over the separation layer 603. The layer 605 in this example includes the insulating film 1224, the auxiliary wiring 1206, the first electrode 1201, and the partition wall 1205.

separation layer 603. Thus, the layer 605 is provided on the temporary supporting substrate 607 side.

Note that in order to easily separate the separation layer 603 from the layer 605, laser light irradiation with a UV laser was performed in this example.

Next, the layer 605 which was separated from the formation substrate 601 and includes the exposed insulating film 1224 (a layer included in the insulating film 1224) was bonded to the supporting substrate 1220 using a UV curable adhesive. A 100-μm-thick polyethylene naphthalate (PEN) film was used as the supporting substrate 1220. The UV curable adhesive was cured by UV light irradiation for 10 minutes, and then, the separation adhesive 609 was removed by washing with water.

Next, the EL layer 1202 and the second electrode 1203 were formed over the first electrode 1201 in the conditions similar to those in the light-emitting device 5.

Then, a photocurable resin containing zeolite which serves as the sealing material 1227 was applied and cured by UV light irradiation for 120 seconds. Further, heat treatment was performed at 80° C. under an air atmosphere for one hour. Then, the supporting substrate 1220 and the thin stainless steel substrate which was the sealing substrate 1228 were bonded with a two component type epoxy resin. Then, the lens diffusion plate (product name: LSD60PC10-F12, produced by Optical Solutions Corporation) which was the light extraction structure 1209 was bonded to the surface of the supporting substrate 1220 using an ultraviolet curable epoxy resin.

<Light-Emitting Device 8>

A manufacturing method of the light-emitting device 8 is similar to that of the light-emitting device 5.

<Light-Emitting Device 9>

A manufacturing method of the light-emitting device 9 is similar to that of the light-emitting device 7. Note that the light extraction structure 1209 was not provided in the light-emitting device 9.

<Characteristics of Light-Emitting Device>

Table 6 shows initial values of main characteristics of the light-emitting devices 5 to 7 at a current density of 0.45 mA/cm$^2$ and the light-emitting devices 8 and 9 at a current density of 2.5 mA/cm$^2$.

TABLE 6

|  | Voltage (V) | Chromaticity (x, y) | Correlated color temperature (K) | Power efficiency (lm/W) | External quantum efficiency (%) |
| --- | --- | --- | --- | --- | --- |
| Light-emitting device 5 | 2.66 | (0.52, 0.47) | 2400 | 88 | 25 |
| Light-emitting device 6 | 2.66 | (0.52, 0.48) | 2500 | 122 | 35 |
| Light-emitting device 7 | 2.76 | (0.52, 0.48) | 2500 | 110 | 33 |
| Light-emitting device 8 | 3.16 | (0.52, 0.49) | 2500 | 94 | 31 |
| Light-emitting device 9 | 3.01 | (0.51, 0.49) | 2700 | 98 | 30 |

In the light-emitting element of this example, the green-light-emitting phosphorescent compound, the orange-light-emitting phosphorescent compound, and the blue-light-emitting fluorescent compound were used as light-emitting substances. Adjustment of emission balance among the phosphorescent and fluorescent light-emitting layers could increase emission efficiency of the light-emitting element.

In the light-emitting element of this example, the electron-transport organic compound is used as a host material of the blue-light-emitting fluorescent compound and is positioned to be the closest to the cathode among the three light-emitting layers; with this structure, light emission from the phosphorescent compounds is easily obtained. Accordingly, the light-emitting element with high emission efficiency was achieved.

Although light emitted from a fluorescent compound is weaker than that from a phosphorescent compound, the light-emitting element of this example is preferable particularly in the case where a strong blue emission is unnecessary and high emission efficiency is required, for example, for a warm-white light-emitting device used as lighting.

The power efficiency of the light-emitting device 6 was 122 lm/W, which was about 1.4 times as high as that of the light-emitting device 5. This is because the light extraction efficiency was increased owing to the light extraction structure 1209 included in the light-emitting device 6. Further, the light-emitting device 7, which is flexible, shows favorable performance equivalent to that of the light-emitting device 6 manufactured over the glass substrate. Note that it has been confirmed that, the light-emitting device in which the film substrate using resin has a thickness of 20 μm is not broken and stable light emission can be obtained if the light-emitting device is bent to a radius curvature of 10 mm.

Figure 17:
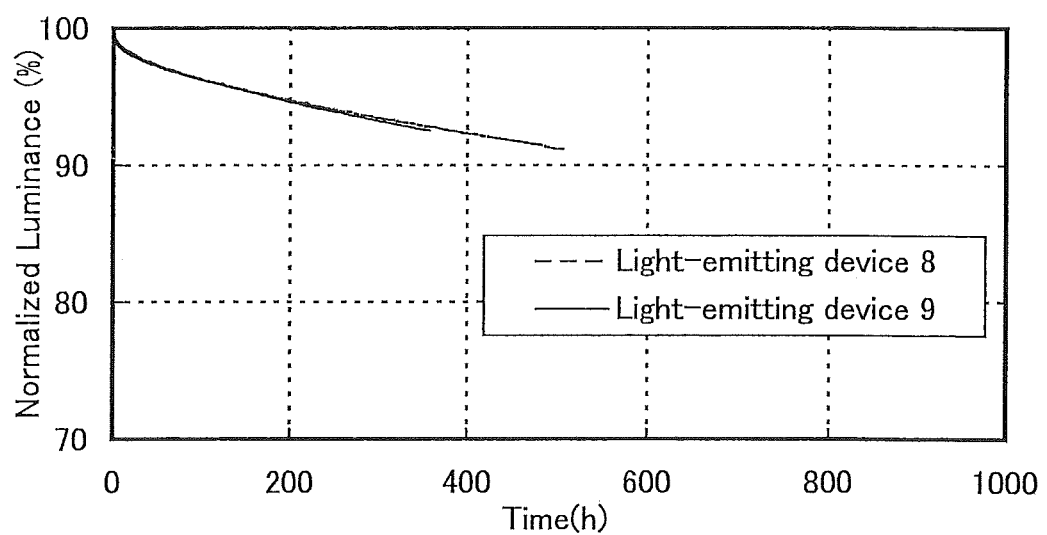
FIG. 17 shows results of a reliability test.

Results of the reliability test of the light-emitting devices 8 and 9 are shown in FIG. 17. In FIG. 17, the vertical axis represents normalized luminance (%) on the assumption that the initial luminance is 100%, and the horizontal axis represents driving time (h) of the elements. In the reliability tests, the light-emitting devices were driven at room temperature under the conditions where the initial luminance was set to 5000 cd/m$^2$ and the current density was constant. This corresponds to an initial luminance of 7000 cd/m$^2$ when the light extraction structure 1209 is provided. It was found from FIG. 17 that the lifetime of the light-emitting device 8 overlaps with that of the light-emitting device 9 and thus there is little difference between their reliabilities. The half decay time of luminance at an initial luminance of 1,000 cd/m$^2$ is 300,000 hours by the estimation based on the results of FIG. 17, which is a favorable driving lifetime.

Example 3

In this example, a light-emitting element of one embodiment of the present invention will be described with reference to FIGS. 18C and 18D. Chemical formulas of materials used in this example are shown below. Note that the materials the chemical formulae of which are described above will be omitted.

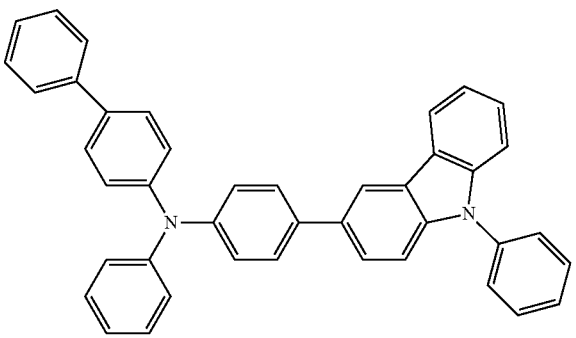

PCBA1BP

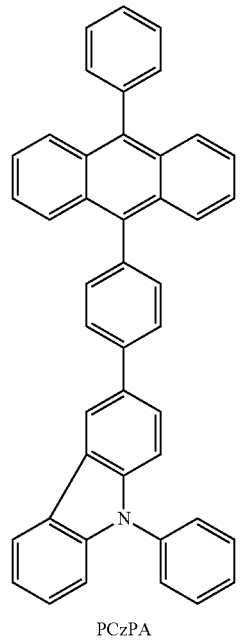

PCzPA

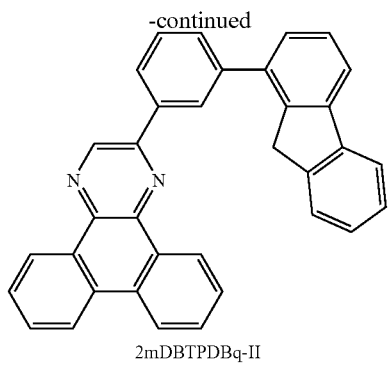

2mDBTPDBq-II

Figure 18C:
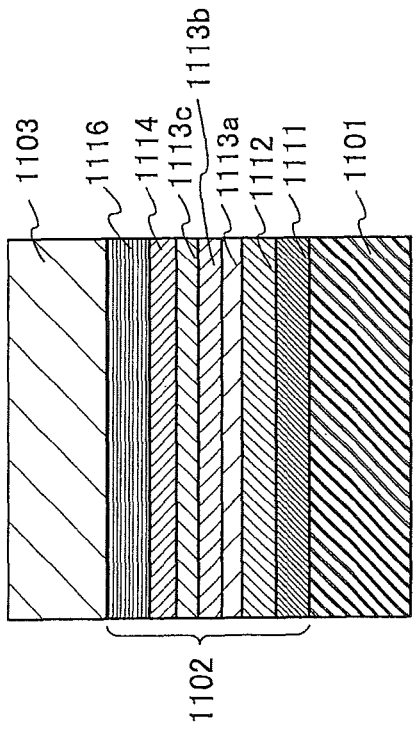

As shown in FIG. 18C, the light-emitting element 1 of this example includes an EL layer 2002a between a first electrode 2001 and a second electrode 2003. The EL layer 2002a includes a hole-injection layer 2011, a hole-transport layer 2012, a first light-emitting layer 2013a, a second light-emitting layer 2013b, a third light-emitting layer 2013c, an electron-transport layer 2014, and an electron-injection layer 2015, which are stacked in this order.

Figure 18D:
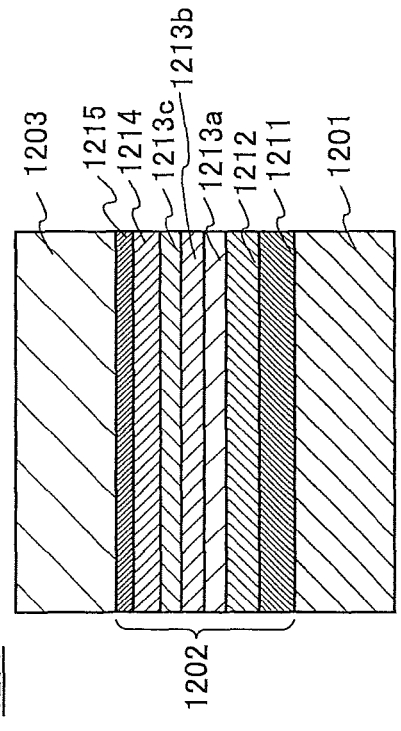

As shown in FIG. 18D, the light-emitting element 2 of this example includes an EL layer 2002b between the first electrode 2001 and the second electrode 2003. The EL layer 2002b includes the hole-injection layer 2011, the hole-transport layer 2012, the first light-emitting layer 2013a, the second light-emitting layer 2013b, the third light-emitting layer 2013c, the electron-transport layer 2014, and the electron-injection layer 2015, which are stacked in this order.

The manufacturing method of the light-emitting element 1 will be described. Note that the manufacturing method of the light-emitting device 2 is similar to that of the light-emitting device 1 except that the first light-emitting layer 2013a and the second light-emitting layer 2013b are formed in reverse order; therefore, specific description is omitted.

First, an ITSO film was formed over a glass substrate serving as a supporting substrate by a sputtering method, so that a first electrode 2001 serving as an anode was formed. The thickness was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate was fixed to a substrate holder in a vacuum evaporation apparatus so that a surface of the glass substrate on which the first electrode 2001 was formed faced downward. The pressure in the vacuum evaporation apparatus was reduced to about $10^{-4}$ Pa. Then, 9-phenyl-3-[4-(10-phenyl-9-anthryl)phenyl]-9H-carbazole (abbreviation: PCzPA) and molybdenum(VI) oxide were deposited on the first electrode 2001 by co-evaporation to form a first hole-injection layer 2011. The thickness thereof was 30 nm. The weight ratio of PCzPA to molybdenum oxide was adjusted to 2:1 (=PCzPA:molybdenum oxide).

Next, a BPAFLP film was formed to a thickness of 20 nm on the hole-injection layer 2011, whereby a hole-transport layer 2012 was formed.

Next, 2-[3-(dibenzothiophen-4-yl)phenyl]-dibenzo[f,h]-quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)$_2$(acac)]) were co-deposited to form the first light-emitting layer 2013a over the hole-transport layer 2012. Here, the weight ratio of 2mDBTPDBq-II (abbreviation) to PCBA1BP (abbreviation) and [Ir(tBuppm)$_2$(acac)] (abbreviation) was adjusted to 0.7:0.3:0.06 (=2mDBTPDBq-II:PCBA1BP:[Ir(tBuppm)$_2$(acac)]). The thickness of the first light-emitting layer 2013a was set to 15 nm.

Next, 2mDBTPDBq-II, PCBA1BP, and [Ir(dppm)$_2$(acac)]) were deposited by co-evaporation, whereby the second light-emitting layer 2013b was formed over the first light-emitting layer 2013a. Here, the weight ratio of 2mDBTPDBq-II to PCBA1BP and [Ir(dppm)$_2$(acac)] was adjusted to 0.7:0.3:0.06 (=2mDBTPDBq-II:PCBA1BP:[Ir(dppm)$_2$(acac)]). The thickness of the second light-emitting layer 2013b was set to 15 nm.

Then, in order to form the third light-emitting layer 2013c over the second light-emitting layer 2013b, CzPA and 1,6mMemFLAPAPrn were deposited to a thickness of 10 nm by co-evaporation. The weight ratio of CzPA to 1,6mMemFLPAPrn was adjusted to 1:0.05 (=CzPA:1, 6mMemFLPAPrn).

Next, CzPA was vapor-deposited to a thickness of 5 nm and then BPhen was vapor-deposited to a thickness of 15 nm, so that the electron-transport layer 2014 was formed over the third light-emitting layer 2013c.

Further, in order to form the electron-injection layer 2015 over the electron-transport layer 2014, LiF was vapor-deposited to a thickness of 1 nm.

Lastly, an aluminum film was formed to a thickness of 200 nm by evaporation as the second electrode 2003 functioning as a cathode. Thus, the light-emitting element 1 of this example was fabricated.

Note that, in the above evaporation process, evaporation was all performed by a resistance heating method.

Table 7 shows element structures of the light-emitting elements obtained as described above in this example.

TABLE 7

| 1st electrode | Hole-injection layer | Hole-transport layer | 1st light-emitting layer | 2nd light-emitting layer | 3rd light-emitting layer | Electron-transport layer | Electron-injection layer | 2nd electrode |
|---|---|---|---|---|---|---|---|---|
| ITSO 110 nm | PCzPA:MoOx (=2:1) 30 nm | BPAFLP 20 nm | * | ** | CzPA:1,6mMemFLPAPrn (=1:0.05) 10 nm | CzPA 5 nm   BPhen 15 nm | LiF 1 nm | Ag 200 nm |

* 1st and 2nd light-emitting layers of 1st light-emitting device are as follows.

1st light-emitting layer          2nd light-emitting layer

TABLE 7-continued

| 2mDBTPDBq-II:PCBA1BP:[Ir(tBuppm)$_2$(acac)] (=0.7:0.3:0.06) 15 nm | 2mDBTPDBq-II:PCBA1BP:[Ir(dppm)$_2$(acac)] (=0.7:0.3:0.06) 15 nm |
|---|---|

\* 1st and 2nd light-emitting layers of 2nd light-emitting device are as follows.

| 1st light-emitting layer | 2nd light-emitting layer |
|---|---|
| 2mDBTPDBq-II:PCBA1BP:[Ir(dppm)$_2$(acac)] (=0.7:0.3:0.06) 15 nm | 2mDBTPDBq-II:PCBA1BP:[Ir(tBuppm)$_2$(acac)] (=0.7:0.3:0.06) 15 nm |

Further, the light-emitting elements of this example were sealed in a glove box containing a nitrogen atmosphere so as not to be exposed to the air (specifically, a sealant was applied onto outer edges of the elements and heat treatment was performed at 80° C. for 1 hour at the time of sealing). Then, the operation characteristics of the light-emitting elements of Example 3 were measured. Note that the measurement was carried out at room temperature (in an atmosphere kept at 25° C.).

The initial values of the main characteristics of the light-emitting element of this example at a luminance of 900 cd/m$^2$ are shown in Table 8.

TABLE 8

| | Voltage (V) | Current density (mA/cm$^2$) | Chromaticity (x, y) | Correlated color temperature (K) | Power efficiency (lm/W) | External quantum efficiency (%) |
|---|---|---|---|---|---|---|
| Light-emitting device 1 | 2.8 | 1.3 | (0.50, 0.49) | 2800 | 76 | 21 |
| Light-emitting device 2 | 2.8 | 1.3 | (0.53, 0.47) | 2300 | 75 | 23 |

The results show that light-emitting elements with favorable characteristics were obtained regardless of the order of forming the light-emitting layer containing a green-light-emitting phosphorescent compound and the light-emitting layer containing an orange-light-emitting phosphorescent compound.

Example 4

In this example, a technique will be described in which part of components of a light-emitting device is formed over a formation substrate and then the components are transferred from the formation substrate to a flexible substrate. This technique can be employed for a manufacturing method of a light-emitting device of one embodiment of the present invention.

<Manufacturing Method of Samples>

In order to manufacture samples 1 to 3 of this embodiment, part of the manufacturing method A (FIGS. 4A to 4E) of a light-emitting device described in Embodiment 3 was employed.

First, a 200-nm-thick silicon oxynitride film was formed as a base film over a glass substrate serving as the formation substrate 601. Then, washing was performed using a hydrogen fluoride aqueous solution of 0.5%.

Next, a 30-nm-thick tungsten film serving as the separation layer 603 was formed over the base film. Then, nitrous oxide (N$_2$O) plasma treatment was performed (conditions: gas (N$_2$O=100 sccm), power of 500 W, pressure of 100 Pa, substrate temperature of 330° C., 240 seconds).

Next, the layer 605 was formed over the separation layer 603. The layer 605 in this example includes an insulating film. For the insulating film, a silicon oxynitride film, a 200-nm-thick silicon nitride film, a 200-nm-thick silicon oxynitride film, a 140-nm-thick silicon nitride oxide film, and a 100-nm-thick silicon oxynitride film were stacked in this order. Note that the thickness of the silicon oxynitride film in contact with the separation layer 603 was 200 nm in the sample 1 and 600 nm in the samples 2 and 3.

After that, heat treatment was performed at 450° C. for 1 hour in a nitrogen atmosphere.

Figure 19A:
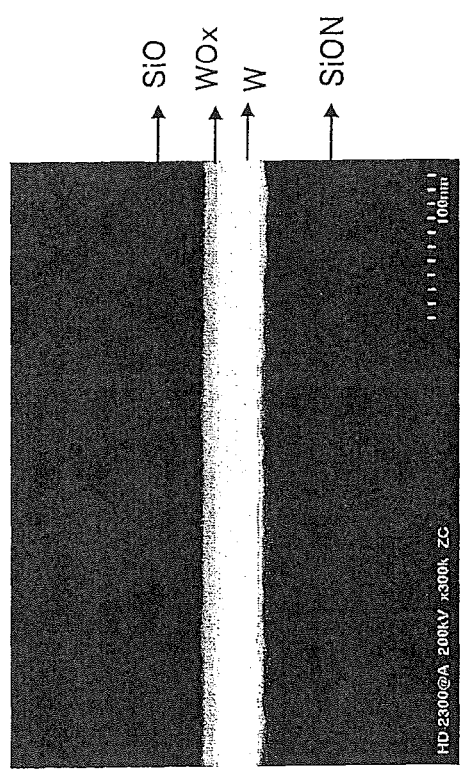
FIGS. 19A to 19C are STEM (Scanning Transmission Electron Microscopy) images of samples according to Example 4.

A cross section of the sample 1 at this stage was observed with a STEM. It was found that, as shown in FIG. 19A, a tungsten oxide film was formed between the tungsten film and the silicon oxynitride film.

Next, the layer 605 was bonded to the temporary supporting substrate 607. A UV curable adhesive film (UV film) was used as the temporary supporting substrate 607 of the sample 2. In the sample 3, a glass substrate was used as the temporary supporting substrate 607, and a UV curable epoxy resin was used as the separation adhesive 609. Then, the layer 605 was separated from the formation substrate 601 along the separation layer 603. At this stage, the layer 605 was attached to the temporary supporting substrate 607 side.

Figure 19B:
Figure 19C:
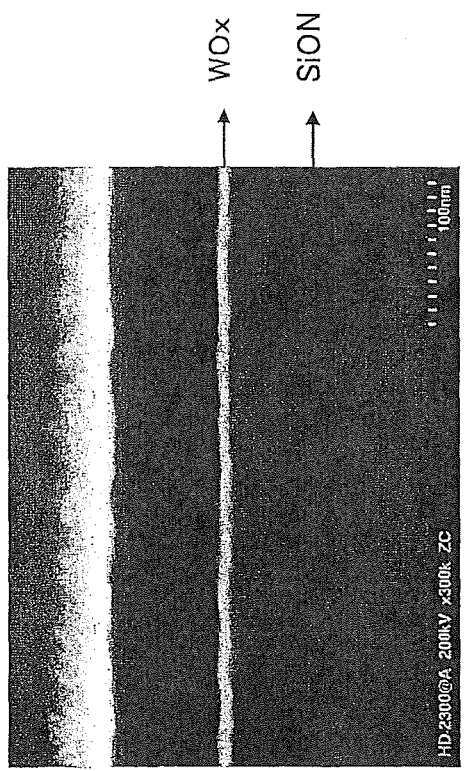

Next, cross sections of the samples 2 and 3 were observed with a STEM. FIG. 19B is a STEM image of the sample 2 on the formation substrate 601 side. FIG. 19C is a STEM image of the sample 3 on the temporary supporting substrate 607 side. As shown in FIGS. 19B and 19C, it was found that the tungsten film was separated from the silicon oxynitride film in the samples 2 and 3. More specifically, since the tungsten film is present on the surface in FIG. 19B and the tungsten oxide film is present on the surface in FIG. 19C, it was found that the tungsten film was separated from the tungsten oxide film in each sample.

Example 5

In this example, a technique will be described in which part of components of a light-emitting device is formed over a formation substrate and then the components are transferred from the formation substrate to a flexible substrate. This technique can be employed for a manufacturing method of a light-emitting device of one embodiment of the present invention.

In the manufacturing method of the light-emitting device 7 of Example 2, the base film, the separation layer 603, and the layer 605 (including an insulating film) were formed in this order over the formation substrate 601. Similarly, in the manufacturing method of the samples in Example 4, the base film, the separation layer 603, and the layer 605 (including an insulating film) were formed in this order over the formation substrate 601.

Specifically, a silicon oxynitride (first SiON) film was foil led as the base film; a tungsten (W) film was formed as the separation layer 603; and a silicon oxynitride (second SiON) film, a silicon nitride (SiN) film, a silicon oxynitride (third SiON) film, a silicon nitride oxide (SiNO) film, and a silicon oxynitride (first SiON) film were stacked in this order as insulating films included in the layer 605.

In this example, single films corresponding to the above-described films were each formed on silicon substrates and stress values were measured. Note that stress values before and after heat treatment were measured in this example. The heat treatment was performed in a nitrogen atmosphere at 450° C. for one hour.

Forming conditions of each film will be described. A 200-nm-thick silicon oxynitride film was formed as the first SiON film. A 30-nm-thick tungsten film was formed as the W film. A 600-nm-thick silicon oxynitride film was formed as the second SiON film. A 200-nm-thick silicon nitride film was formed as the SiN film. A 200-nm-thick silicon oxynitride film was formed as the third SiON film. A 200-nm-thick silicon oxynitride film was formed as the SiNO film.

Figure 20:
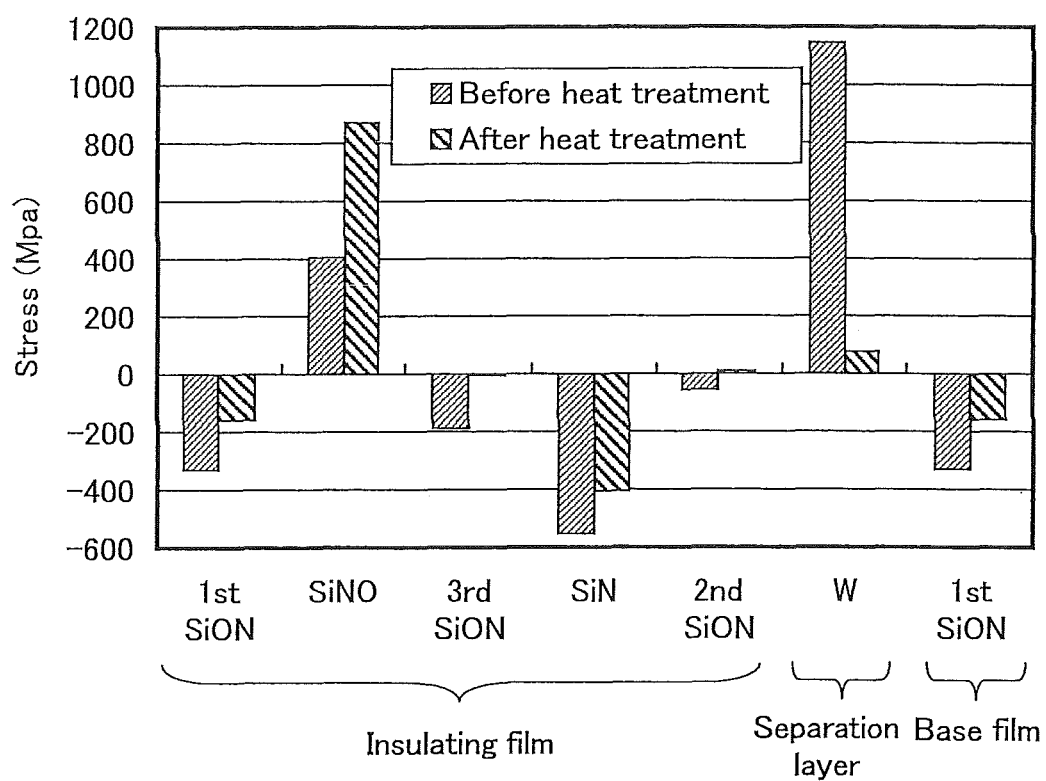
FIG. 20 shows measurement results of stress values of Example 5.

Measurement results of stress values are shown in Table 9 and FIG. 20.

TABLE 9

| | Film | Thickness [nm] | Stress value [Mpa] | |
|---|---|---|---|---|
| | | | before heat treatment | after heat treatment |
| Insulating film | 1st SiON | 200 | −332 | −160 |
| | SiNO | 200 | 406 | 870 |
| | 3rd SiON | 200 | −187 | −5.70 |
| | SiN | 200 | −554 | −406 |
| | 2nd SiON | 600 | −55.1 | 11.6 |
| Separation layer | W | 30 | 1150 | 77.0 |
| Base film | 1st SiON | 200 | −332 | −156 |

It was found that the stress value of the W film which is a separation layer was greatly decreased by the heat treatment. Further, it was found that the stress value of the second SiON film which is an insulating film in contact with the separation layer was changed from positive to negative by the heat treatment. The results in Example 4 show that separation occurs between the W film and the second SiON film when the layer is separated from the formation substrate. Therefore, these results suggest that separation is easily caused in the film whose stress value is changed by the heat treatment (i.e., the stress value is greatly decreased, the stress value is changed from positive to negative, or the like).

Example 6

Figure 21:
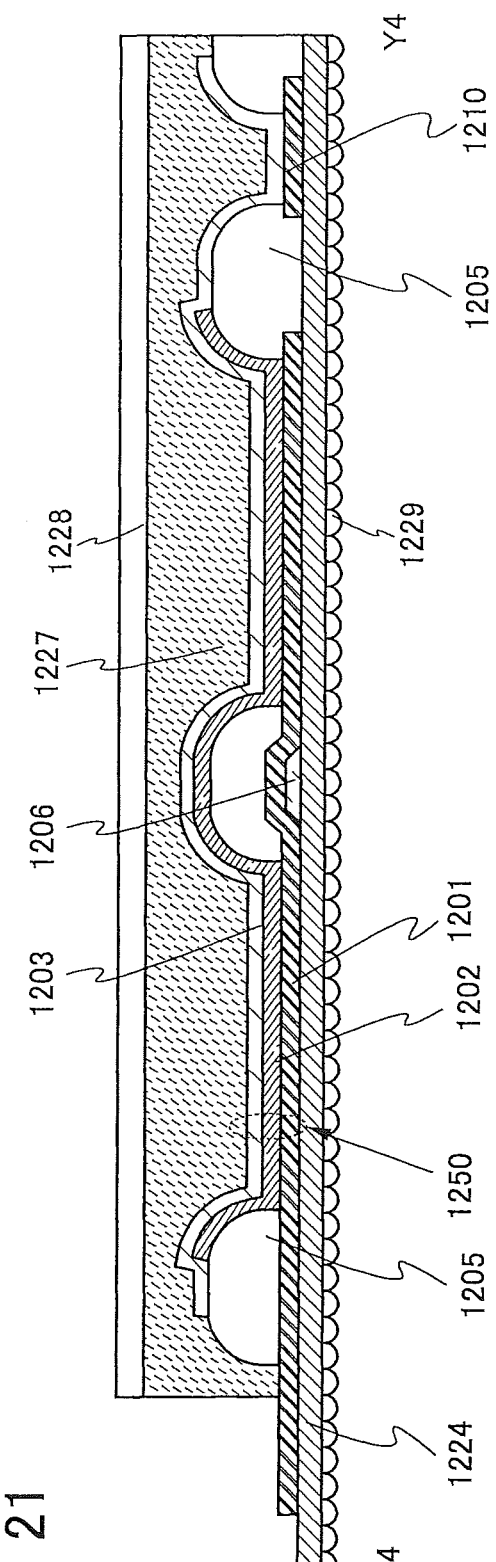
FIG. 21 illustrates a light-emitting device of Example 6.

In Example 6, a light-emitting device which is one embodiment of the present invention is described. In this example, a bottom-emission light-emitting device was manufactured. FIG. 10D is a plan view of a light-emitting device 10 manufactured in this example. FIG. 21 is a cross-sectional view taken along dashed-dotted line X4-Y4 in FIG. 10D. Note that some components of the light-emitting device are omitted in FIG. 10D.

<Structure of Light-Emitting Device>

First, the structure of the light-emitting device 10 manufactured in this example will be described. In the light-emitting device 10, the light-emitting element 1250 is provided over a support 1229 with an insulating film 1224 interposed therebetween. The area of a light-emitting region of the light-emitting element 1250 is 56 mm×42 mm. The auxiliary wiring 1206 is provided over the insulating film 1224 and is electrically connected to the first electrode 1201. The end portion of the first electrode 1201 and the end portion of the terminal 1210 are covered with the partition wall 1205. Further, the partition wall 1205 is provided to cover the auxiliary wiring 1206 with the first electrode 1201 provided therebetween. The support 1229 and a sealing substrate 1228 are bonded with a sealing material 1227. The support 1229 is a polyester-resin diffusion film and serves as a supporting substrate and a light extraction structure. The light-emitting device 10 is a flexible light-emitting device.

A specific structure of the light-emitting element 1250 included in the light-emitting device 10 is shown in FIG. 18B. Example 2 can be referred to for the details of the structure of the light-emitting element 125.

<Manufacturing Method of Light-Emitting Device>

Next, a manufacturing method of the light-emitting device 10 is described.

<Light-Emitting Device 10>

The light-emitting device 10 was manufactured in a manner similar to that of the light-emitting device 7 except the EL layer 1202, the insulating film 1224, and the support 1229; thus, description of steps similar to those in the light-emitting device 7 is omitted.

A manufacturing method of the EL layer 1202 in the light-emitting device 10 will be described.

First, the supporting substrate 1200 over which the first electrode 1201 was formed was fixed to a substrate holder provided in the vacuum evaporation apparatus so that the surface on which the first electrode 1201 was formed faced downward. The pressure in the vacuum evaporation apparatus was reduced to about $10^{-4}$ Pa. After that, over the first electrode 1201, DBT3P-II and molybdenum oxide were deposited by co-evaporation by an evaporation method using resistance heating, so that the hole-injection layer 1211 was formed over the first electrode 1201. The thickness was 30 nm, and the weight ratio of DBT3P-II to molybdenum oxide was adjusted to 2:1 (=DBT3P-II:molybdenum oxide).

Next, in order to form the hole-transport layer 1112 over the hole-injection layer 1111, BPAFLP and PCzPCN1 were deposited by co-evaporation to a thickness of 20 nm. The weight ratio of BPAFLP to PCzPCN1 was adjusted to 1:1 (=BPAFLP:PCzPCN1).

Further, a first light-emitting layer 1113a was formed over the hole-transport layer 1112 by co-evaporation of 2mDBT-BPDBq-II, PCzPCN1, and [Ir(tBuppm)₂(acac)]. Here, the weight ratio of 2mDBTBPDBq-II to PCzPCN1 and [Ir(tBuppm)₂(acac)] was adjusted to 0.7:0.3:0.06 (=2mDBTB-PDBq-II:PCzPCN1:[Ir(tBuppm)₂(acac)]). The thickness of the first light-emitting layer 1113a was set to 12 nm.

Next, 2mDBTBPDBq-II, PCzPCN1, and [Ir(dppm)₂(acac)]) were deposited by co-evaporation, whereby the second light-emitting layer 1113b was formed over the first light-emitting layer 1113a. Here, the weight ratio of 2mDBTBPDBq-II, PCzPCN1, and [Ir(dppm)₂(acac)] was adjusted to 0.8:0.2:0.06 (=2mDBTBPDBq-II:PCzPCN1:[Ir(dppm)₂(acac)]). In addition, the thickness of the second light-emitting layer 1113b was set to 18 nm.

Then, in order to form the third light-emitting layer 1113c over the second light-emitting layer 1113b, CzPA and 1,6mMemFLAPAPrn were deposited to a thickness of 10 nm by co-evaporation. The weight ratio of CzPA to 1,6mMemFLPAPrn was adjusted to 1:0.05 (=CzPA:1, 6mMemFLPAPrn).

Next, CzPA was vapor-deposited to a thickness of 5 nm and then BPhen was vapor-deposited to a thickness of 15 nm, so that the electron-transport layer 1114 was formed over the third light-emitting layer 1113c.

Further, in order to form the electron-injection layer 1215 over the electron-transport layer 1214, LiF was vapor-deposited to a thickness of 1 nm.

Finally, in order to form the second electrode 1203 serving as a cathode, silver (Ag) and magnesium (Mg) were deposited to a thickness of 1 nm by co-evaporation and further silver (Ag) was vapor-deposited to a thickness of 250 nm. Here, the volume ratio of Ag to Mg was adjusted to 1:0.3 (=Ag:Mg).

Note that, in the above evaporation process, evaporation was all performed by a resistance heating method.

Table 10 shows element structure of the light-emitting element manufactured as described above.

tioned to be the closest to the cathode among the three light-emitting layers; with this structure, light emission from the phosphorescent compounds is easily obtained. Accordingly, the light-emitting element with high emission efficiency was achieved.

Although light emitted from a fluorescent compound is weaker than that from a phosphorescent compound, the light-emitting element of this example is preferable particularly in the case where a strong blue emission is unnecessary and high emission efficiency is required, for example, for a warm-white light-emitting device used as lighting.

The power efficiency of the light-emitting device 10 at a current density of 0.81 mA/cm$^2$ was 131 lm/W and the voltage was 2.63 V. On the other hand, the power efficiency of the light-emitting device 7 of Example 2 at a current density of 0.90 mA/cm$^2$ was 1091 lm/W and the voltage was 2.95 V. From these results, it was found that the light-emitting device 10 had lower driving voltage and higher efficiency than the light-emitting device 7. Since a light-emitting element capable of forming an exciplex is used in the light-emitting device 10, the driving voltage is low. Further, the light-emitting device 10 includes the insulating film 1224 whose structure is different from that of the

TABLE 10

| 1st electrode | Hole-injection layer | Hole-transport layer | 1st light-emitting layer | 2nd light-emitting layer |
|---|---|---|---|---|
| ITSO 110 nm | DBT3P-II:MoOx (=2:1) 30 nm | BPAFLP:PCzPCN1 (=1:1) 20 nm | 2mDBTBPDBq-II:PCzPCN1:[Ir(tBuppm)$_2$(acac)] (=0.7:0.3:0.06) 12 nm | 2mDBTBPDBq-II:PCzPCN1:[Ir(dppm)$_2$(acac)] (=0.8:0.2:0.06) 18 nm |

| | 3rd light-emitting layer | Electron-transport layer | Electron-injection layer | 2nd electrode |
|---|---|---|---|---|
| | CzPA:1,6mMemFLPAPrn (=1:0.05) 10 nm | CzPA 5 nm  BPhen 15 nm | LiF 1 nm | Ag:Mg (=1:0.3) 1 nm  Ag 250 nm |

For the insulating film 1224 in the light-emitting device 10, a 600-nm-thick silicon oxynitride film, a 100-nm-thick silicon nitride film, and a 150-nm-thick silicon oxynitride film were stacked in this order.

In the light-emitting device 10, the layer 605 which was separated from the formation substrate 601 and includes the exposed insulating film 1224 was bonded to the support 1229 using a UV curable adhesive.

<Characteristics of Light-Emitting Device>

Table 11 shows initial values of main characteristics of the light-emitting device 10 at a current density of 0.81 mA/cm$^2$.

light-emitting device 7. In addition, the light-emitting device 10 does not include the supporting substrate 1220 and a UV curable epoxy resin for bonding the light extraction structure 1209 to the supporting substrate 1220, and instead include the support 1229. For these reasons, the light extraction efficiency is improved and thus the power efficiency is high.

This application is based on Japanese Patent Application serial No. 2012-261011 filed with Japan Patent Office on Nov. 29, 2012, Japanese Patent Application serial No. 2012-264071 filed with Japan Patent Office on Dec. 3, 2012, and Japanese Patent Application serial No. 2013-043643 filed

TABLE 11

| | Voltage (V) | Chromaticity (x, y) | Correlated color temperature (K) | Power efficiency (lm/W) | External quantum efficiency (%) |
|---|---|---|---|---|---|
| Light-emitting device 10 | 2.63 | (0.49, 0.50) | 3000 | 131 | 34 |

In the light-emitting element of this example, the green-light-emitting phosphorescent compound, the orange-light-emitting phosphorescent compound, and the blue-light-emitting fluorescent compound were used as light-emitting substances. Adjustment of emission balance among the phosphorescent and fluorescent light-emitting layers could increase emission efficiency of the light-emitting element.

In the light-emitting element of this example, the electron-transport organic compound is used as a host material of the blue-light-emitting fluorescent compound and is posiwith Japan Patent Office on Mar. 6, 2013, the entire contents of which are hereby incorporated by reference.

What is claimed is:

1. A light-emitting device comprising:
a first electrode;
a hole-transport layer over the first electrode, the hole-transport layer comprising a first organic compound;

a first light-emitting layer over the hole-transport layer, the first light-emitting layer comprising a first phosphorescent compound and a second organic compound;
a second light-emitting layer over the first light-emitting layer, the second light-emitting layer comprising a second phosphorescent compound and a third organic compound;
a third light-emitting layer over the second light-emitting layer, the third light-emitting layer comprising a fluorescent compound and a fourth organic compound;
an electron-transport layer over the third light-emitting layer, the electron-transport layer comprising a fifth organic compound;
a second electrode over the electron-transport layer;
a partition wall over the first electrode; and
a wiring electrically connected to the second electrode,
wherein the partition wall is in contact with the wiring.

2. The light-emitting device according to claim 1,
wherein a maximum emission wavelength of the first phosphorescent compound is one of greater than 500 nm and less than or equal to 570 nm or greater than 570 nm and less than or equal to 620 nm,
wherein a maximum emission wavelength of the second phosphorescent compound is the other of greater than 500 nm and less than or equal to 570 nm or greater than 570 nm and less than or equal to 620 nm, and
wherein a maximum emission wavelength of the fluorescent compound is greater than or equal to 400 nm and less than or equal to 500 nm.

3. The light-emitting device according to claim 1, wherein the second organic compound is the same compound as at least one of the first organic compound and the third organic compound.

4. The light-emitting device according to claim 1, wherein the fourth organic compound is the same compound as the fifth organic compound.

5. The light-emitting device according to claim 1,
wherein the second organic compound is the same compound as at least one of the first organic compound and the third organic compound, and
wherein the fourth organic compound is the same compound as the fifth organic compound.

6. The light-emitting device according to claim 1, wherein the fluorescent compound comprises a pyrene skeleton.

7. The light-emitting device according to claim 1, wherein at least one of the fourth organic compound and the fifth organic compound comprises an anthracene skeleton.

8. The light-emitting device according to claim 1, wherein a correlated color temperature of the light-emitting device is greater than or equal to 2300 K and less than or equal to 3100 K.

9. An electronic device comprising the light-emitting device according to claim 1.

10. A lighting device comprising the light-emitting device according to claim 1.

11. A light-emitting device comprising:
a first electrode;
a hole-injection layer over the first electrode, the hole-injection layer comprising a hole-injection substance;
a hole-transport layer over the hole-injection layer, the hole-transport layer comprising a first organic compound;
a first light-emitting layer over the hole-transport layer, the first light-emitting layer comprising a first phosphorescent compound and a second organic compound;
a second light-emitting layer over the first light-emitting layer, the second light-emitting layer comprising a second phosphorescent compound and a third organic compound;
a third light-emitting layer over the second light-emitting layer, the third light-emitting layer comprising a fluorescent compound and a fourth organic compound;
an electron-transport layer over the third light-emitting layer, the electron-transport layer comprising a fifth organic compound;
an electron-injection layer over the electron-transport layer, the electron-injection layer comprising an electron-injection substance;
a second electrode over the electron-injection layer,
a partition wall over the first electrode; and
a wiring electrically connected to the second electrode,
wherein the partition wall is in contact with the wiring.

12. The light-emitting device according to claim 11,
wherein a maximum emission wavelength of the first phosphorescent compound is one of greater than 500 nm and less than or equal to 570 nm or greater than 570 nm and less than or equal to 620 nm,
wherein a maximum emission wavelength of the second phosphorescent compound is the other of greater than 500 nm and less than or equal to 570 nm or greater than 570 nm and less than or equal to 620 nm, and
wherein a maximum emission wavelength of the fluorescent compound is greater than or equal to 400 nm and less than or equal to 500 nm.

13. The light-emitting device according to claim 11, wherein the second organic compound is the same compound as at least one of the first organic compound and the third organic compound.

14. The light-emitting device according to claim 11, wherein the fourth organic compound is the same compound as the fifth organic compound.

15. The light-emitting device according to claim 11,
wherein the second organic compound is the same compound as at least one of the first organic compound and the third organic compound, and
wherein the fourth organic compound is the same compound as the fifth organic compound.

16. The light-emitting device according to claim 11, wherein the fluorescent compound comprises a pyrene skeleton.

17. The light-emitting device according to claim 11, wherein at least one of the fourth organic compound and the fifth organic compound comprises an anthracene skeleton.

18. The light-emitting device according to claim 11, wherein a correlated color temperature of the light-emitting device is greater than or equal to 2300 K and less than or equal to 3100 K.

19. The light-emitting device according to claim 11, wherein at least one of the hole-injection layer and the electron-injection layer comprises a charge-generation region.

20. An electronic device comprising the light-emitting device according to claim 11.

21. A lighting device comprising the light-emitting device according to claim 11.

* * * * *